(12) United States Patent
Waheed et al.

(10) Patent No.: US 7,808,325 B2
(45) Date of Patent: Oct. 5, 2010

(54) SYSTEM AND METHOD FOR FREQUENCY PUSHING/PULLING COMPENSATION

(75) Inventors: Khurram Waheed, Plano, TX (US); Khurram Muhammad, Dallas, TX (US); Jingcheng Zhuang, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 163 days.

(21) Appl. No.: 12/326,569

(22) Filed: Dec. 2, 2008

(65) Prior Publication Data

US 2009/0268791 A1    Oct. 29, 2009

Related U.S. Application Data

(60) Provisional application No. 61/047,619, filed on Apr. 24, 2008.

(51) Int. Cl.
*H03L 7/085* (2006.01)

(52) U.S. Cl. ...................... 331/1 A; 331/16; 375/222; 375/232; 375/233; 375/346; 375/350

(58) Field of Classification Search ................ 331/1 A; 375/22, 232, 233, 350, 346
See application file for complete search history.

(56) References Cited

U.S. PATENT DOCUMENTS

| | | | |
|---|---|---|---|
| 7,046,098 B2 * | 5/2006 | Staszewski | 331/158 |
| 7,375,592 B2 * | 5/2008 | Skerritt | 331/16 |
| 7,391,271 B2 * | 6/2008 | Cranford et al. | 331/17 |
| 7,400,205 B2 * | 7/2008 | Niwa | 331/34 |
| 2008/0172193 A1 * | 7/2008 | Rhee et al. | 702/69 |
| 2008/0284530 A1 * | 11/2008 | Pellerano et al. | 331/1 A |

* cited by examiner

*Primary Examiner*—Joseph Chang
*Assistant Examiner*—Jeffrey Shin
(74) *Attorney, Agent, or Firm*—Ronald O. Neerings; Wade James Brady, III; Frederick J. Telecky, Jr.

(57) ABSTRACT

A system and method for frequency pushing/pulling compensation in phase-locked loops including a method for cancelling frequency push/pull in an oscillator of a transmitter. The method includes computing an error signal from a signal of a phase locked loop, wherein the error signal includes an aggressor signal. Transfer characteristics are computed for the aggressor signal. A transmitted signal is filtered using the transfer characteristics to produce a correction term. The correction term is applied to a frequency control word being provided to the oscillator.

25 Claims, 19 Drawing Sheets

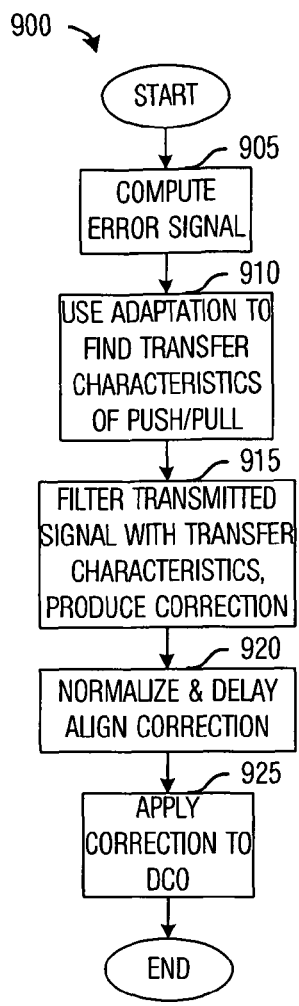
Fig. 9
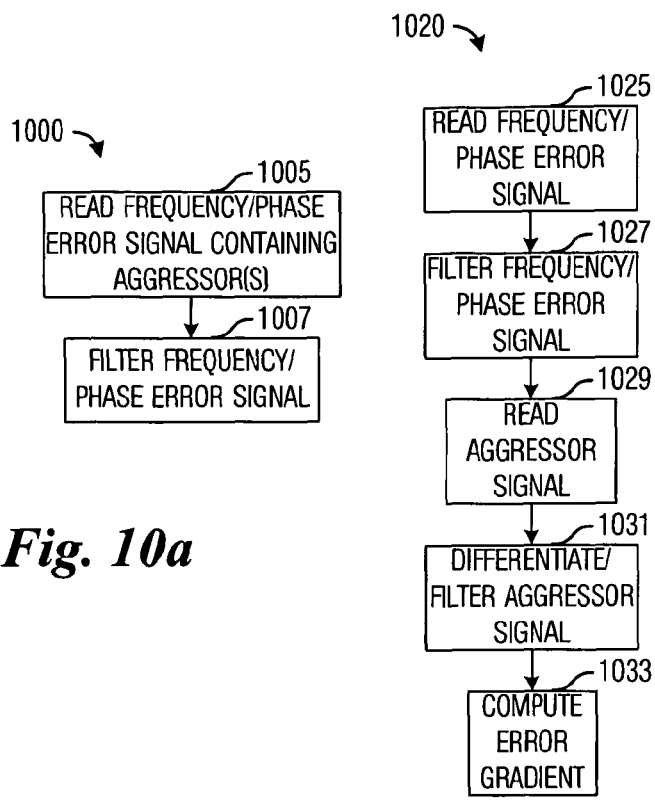
Fig. 10a
Fig. 10b
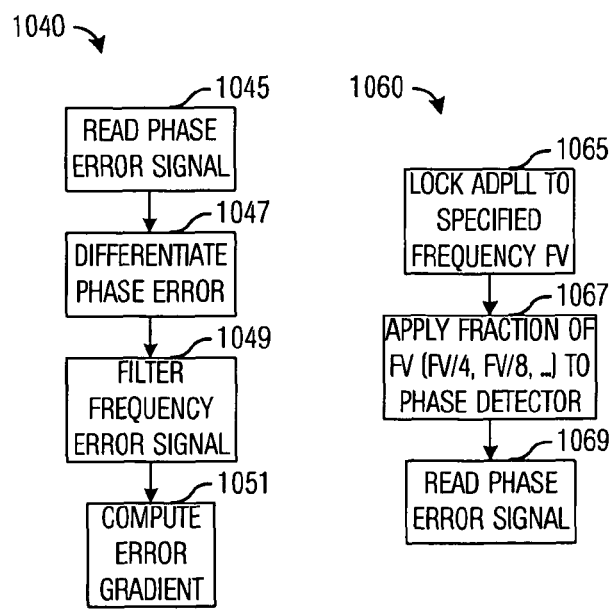
Fig. 10c
Fig. 10d

SYSTEM AND METHOD FOR FREQUENCY PUSHING/PULLING COMPENSATION

This application claims the benefit of U.S. Provisional Application No. 61/047,619, filed Apr. 24, 2008, entitled "A Method and Apparatus of Compensating an ADPLL from Frequency Pushing," which application is hereby incorporated herein by reference.

TECHNICAL FIELD

The present invention relates generally to a system and method for electronic circuits, and more particularly to a system and method for frequency pushing/pulling compensation in phase-locked loops (PLL).

BACKGROUND

The oscillation stability of a voltage controlled oscillators (VCO) may be perturbed by a number of aggressors present in their operational vicinity. The oscillator operational contamination may typically be due to frequency pushing/pulling of an oscillator core. To differentiate between the two (pushing and pulling), oscillator pushing may be categorized to be a change in the oscillator caused by changes in a supply voltage and/or electrical ground. Such artifacts present in the supply voltage or electrical ground may be caused by a number of factors, including but not limited to: a current rush caused by other circuits operating in a general vicinity, electrical ground contamination due to wiring and bonding resistances and parasitics, and so forth. On the contrary, oscillator pulling is due to the factors that impact the normal operation of the oscillator including but not limited to the interactions of the DCO core with its radiofrequency harmonics, interactions with similar RF frequencies elsewhere in a transmitter (including RF output), e.g., injection locking, and the impact of aggressors impacting the self-oscillation and the quality factor of the oscillator core, e.g., by electrical, magnetic or electro-magnetic coupling, etc.

Pushing/pulling of oscillators may be true for oscillators that are controlled by either analog or digital techniques. For example, frequency pushing/pulling may be a problem in a digitally controlled oscillator (DCO) that implements a capacitance of a tank circuit with segmented banks of capacitors controlled by a digital engine, such as an all-digital PLL (ADPLL). Even oscillators without tuning may be subject to pushing/pulling since they may also be subject to the aggressors like tunable oscillators.

As an example, when a transmitter's output power changes, the power supply may not be able to filter out the sudden change in the supply voltage and as a result, the oscillator's frequency may jump instantaneously. This may be interpreted as an instantaneous change in VCO or DCO gain (KVCO or KDCO). If the ADPLL has sufficient tuning range, the PLL lock may not be lost and the ADPLL may eventually recover depending on a bandwidth of a loop filter in the ADPLL. However, the transmitter's error vector magnitude (EVM), root mean square (RMS) and peak phase error, as well as spectrum may be severely degraded while the ADPLL recovers.

FIG. 1 illustrates a prior art oscillator 100. The oscillator 100 includes a phase detector 105, a loop filter 110, an oscillator 115, a resonator 120, and a frequency divider 125. A reference signal, $f_{REF}$, may be input to the phase detector 105. The phase detector 105 may generate a phase error that may be proportional to a phase difference between the reference signal and a radio frequency (RF) continuous wave signal. The phase error may be filtered by the loop filter 110 to produce a slowly varying frequency command signal. The frequency command signal may be provided to the oscillator 115, typically a VCO or a DCO, which produces an RF signal, $f_{LO}$. The RF signal may be dependent on the frequency command signal. The oscillator 115 may make use of the resonator 120 that oscillates in a desired frequency band. The RF signal may also be provided to the frequency divider 125 that may be used to generate the RF continuous wave signal by dividing the RF signal by N, which may be used by the phase detector 105.

FIG. 2 illustrates the oscillator 100 along with sources of aggressors that may cause frequency pushing/pulling. Possible aggressors may include power supply and ground bounce, RF leakage from on-chip coils and circuits that may be located in a pre-power amplifier section of a transceiver, RF output leakage from the transceiver's output, RF leakage from power amplifiers and other components, and so forth. These aggressors may all affect the oscillator 100.

A wide range of techniques have been used in the past to help mitigate frequency pushing/pulling, including: isolating the oscillator by physically separating the oscillator from other circuitry, using very high Q oscillators, using series ferrite elements, using an offset synthesizer architecture, improving the decoupling between the supply voltage and electrical ground and the oscillator, reducing electrical ground bounce, and so forth.

SUMMARY OF THE INVENTION

These and other problems are generally solved or circumvented, and technical advantages are generally achieved, by embodiments of a system and a method for frequency pushing/pulling compensation in phase-locked loops.

In accordance with an embodiment, a method for cancelling frequency push/pull in an oscillator of a transmitter is provided. The method includes computing an error signal from a signal of a phase locked loop, computing transfer characteristics for an aggressor signal, filtering a transmitted signal of the transmitter with the transfer characteristics to produce a correction term, and applying the correction term to a frequency control word being provided to the oscillator. The error signal includes the aggressor signal.

In accordance with another embodiment, a circuit for frequency push/pull compensation of an oscillator is provided. The circuit includes a filter coupled to an error signal source, an adaptation unit coupled to the filter and to a transmit signal path, a compensation unit coupled to the adaptation unit and to the transmit signal path, and a normalizer coupled to the compensation unit. The filter attenuates unwanted frequency noise in an error signal provided by the error signal source, the adaptation unit estimates transfer characteristics of an aggressor signal present in the error signal using a transmit signal from the transmit signal path, and the compensation unit generates a correction term from the transmit signal by applying the transfer characteristics. The normalizer normalizes the correction term to a gain of the oscillator.

In accordance with another embodiment, a transceiver is provided. The transceiver includes a digital transmit path coupled to a data source, an analog transmit path coupled to the digital transmit path, a digital oscillator path, an analog oscillator path coupled to the digital oscillator path, and a frequency compensation unit coupled to the digital transmit path and to the digital oscillator path and to the analog oscillator path. The digital transmit path performs digital signal processing on transmit data provided by the data source, and the analog transmit path performs analog signal processing on transmit data provided by the digital transmit path. The digital oscillator path produces a control signal for use generating a radio frequency signal, wherein the control signal is based on difference between a reference radio frequency signal and a feedback signal based on an actual frequency of the radio frequency signal, while the analog oscillator path produces the radio frequency signal based on the control signal. The frequency compensation unit generates a correction term to compensate for frequency push/pull due to an aggressor signal induced onto the control signal.

An advantage of an embodiment is that the design of an analog portion of a power management system and of the oscillator may be relaxed. This may enable a simpler design that may be less expensive, more reliable, smaller, and so forth.

A further advantage of an embodiment is that expensive frequency pushing/pulling compensation techniques requiring electrical isolation, high performance components, and so forth may no longer be needed. This may lead to a simpler design that is less expensive, smaller, more reliable, and so forth.

Yet another advantage of an embodiment is that it may be adaptable to a range of aggressors causing frequency pushing/pulling. Therefore, a single embodiment may be able to mitigate frequency pushing/pulling from a number of different aggressor types, rather than utilizing multiple frequency pushing/pulling mitigation techniques, each of which may potentially be capable of only reducing frequency pushing/pulling from a small number of aggressor types.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which:

FIG. 9 is a diagram of a sequence of events in the cancellation of frequency push/pull occurring in a VCO or a DCO;
FIGS. 10a through 10d are diagrams of sequences of events in computing an error signal.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a wireless communications device adherent to a 2G or 3G cellular communications standard, such as Enhanced Data for GSM Evolution (EDGE), Wideband Code Division Multiple Access (WCDMA), Bluetooth-Enhanced Data Rate (BT-EDR), Wireless Local Area Network (WLAN), Worldwide Interoperability for Microwave Access (WiMAX), Long-Term Evolution (LTE), and so forth. The invention may also be applied, however, to other wireless communications devices adherent to other cellular communications standards, as well as to wireless transmitters operating in potentially noisy environments with strict power level requirements, power ramping requirements, spectral requirements, and so forth.

Figure 3A:
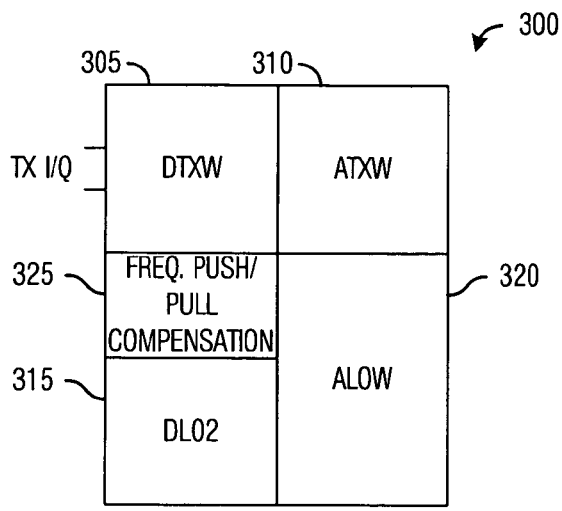
FIG. 3a is a high-level diagram of a transmitter.

FIG. 3a illustrates a high level modular diagram of a transmitter 300. The transmitter 300 may be partitioned into several blocks, including a digital transmit block 305, an analog transmit block 310, a digital local oscillator block 315, an analog local oscillator block 320, and a frequency push/pull compensation block 325. The digital transmit block 305 may be used to perform digital signal processing on data being transmitted. Similarly, the analog transmit block 310 may be used to perform analog signal processing on data being transmitted. The digital local oscillator 315 may perform the digital processing required to generate a local oscillator signal, while the analog local oscillator block 320 may perform the analog processing needed to generate the local oscillator signal.

The frequency push/pull compensation block 325 may be used to provide compensation for changes in the local oscillator signal due to frequency pushing/pulling created by aggressors created by the transmitter 300. Examples of aggressors may include power supply and ground bounce, RF leakage from on-chip coils and circuits from the analog transmit block 310, RF output leakage from transmitter output also from the analog transmit block 310, RF leakage from a power amplifier and other components, and so forth. The frequency push/pull compensation block 325 may characterize the aggressor(s) affecting the local oscillator signal and then compensate (eliminate or reduce) the impact of the aggressors.

Figure 3B:
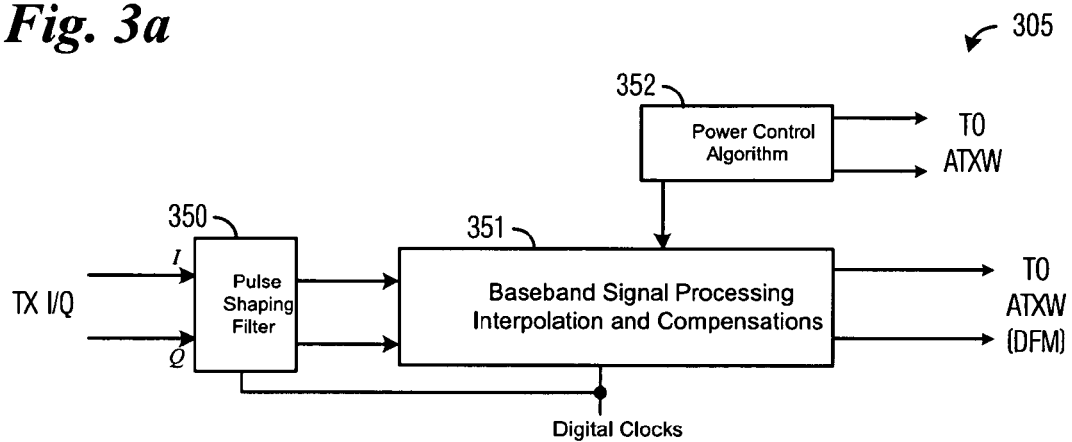
FIG. 3b is a diagram of a digital transmit block.

FIG. 3b illustrates a block view of the digital transmit block 305. The digital transmit block 305 includes a pulse shaping filter 350 that may be used to limit an effective bandwidth of the data being transmitted. The transmit block 305 also includes a baseband signal processing block 351 and a power control algorithm unit 352. The baseband signal processing block 351 may be used to perform operations such as interpolation, compensation, and so forth, on the data being transmitted, while the power control algorithm unit 352 may implement a power control algorithm based on a communications standard to help control the power of the transmission.

Figure 3E:
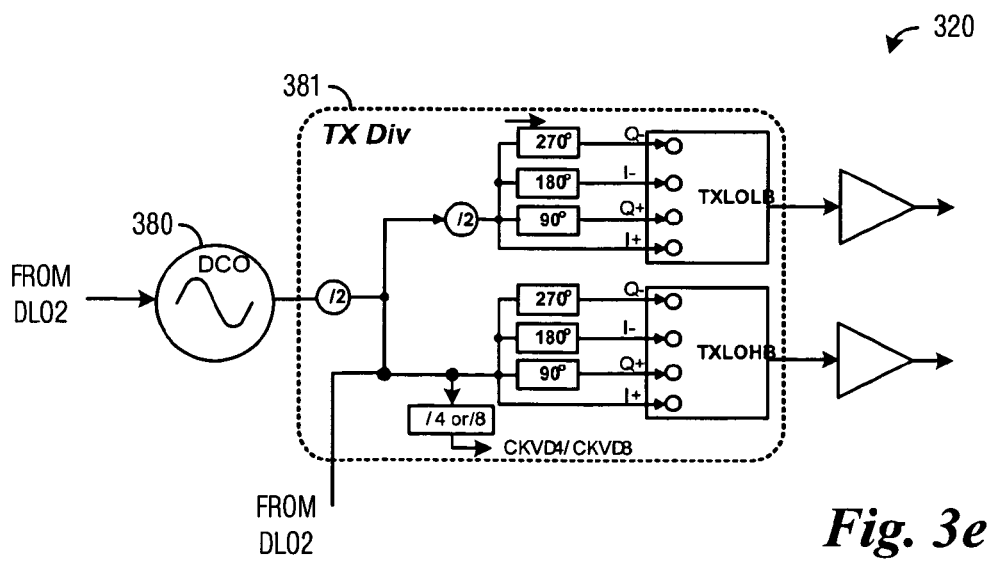
FIG. 3e is a diagram of an analog local oscillator block.
Figure 3C:
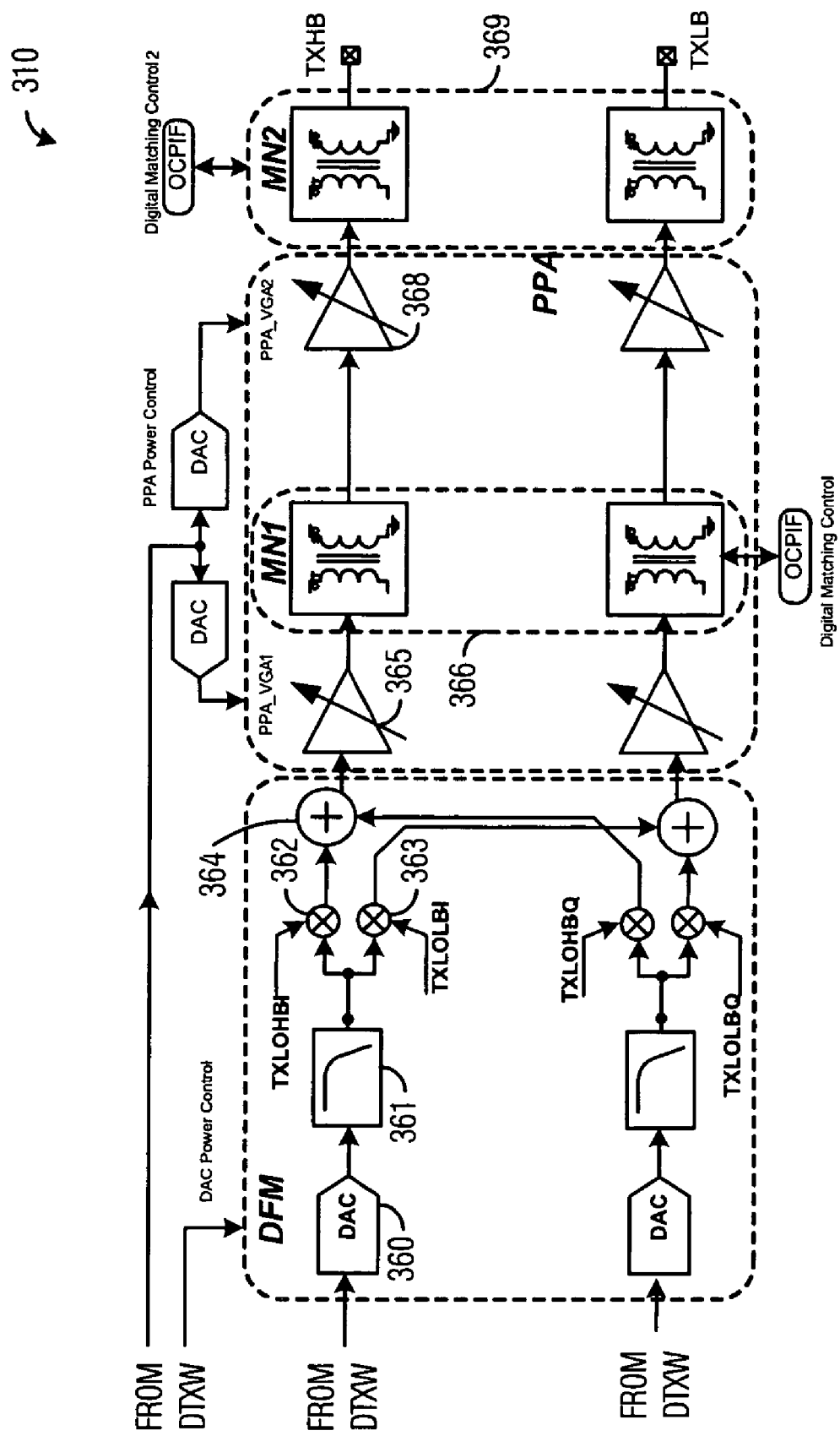
FIG. 3c is a diagram of an analog transmit block.

FIG. 3c illustrates a block view of the analog transmit block 310. The analog transmit block 310 includes I and a Q quadrature signal paths. The discussion that follows focuses on the I signal path, with the Q signal path being substantially similar. The I signal path includes a digital-to-analog converter 360, a filter 361, a high-band mixer 362, a low-band mixer 363, and a summing point 364 to combine the high-band I and the high-band Q modulation phases into a single high-band/low-band RF signal.

The radio-frequency signal containing the complex modulated high-band or low-band carrier phases may then undergo amplification/attenuation with a pre-power amplifier (PPA) 365. The PPA 365 is labeled PPA_VGA1 in FIG. 3c. Depending on the output power and noise requirements, PPA_VGA1 365 may be implemented as a controllable attenuator. A first matching network 366 may be used to help match impedances and/or convert the RF signal from differential to single-ended. A second amplifier (PPA_VGA2) 368 may provide amplification to the RF signal. The PPA_VGA2 368 may be implemented as a differential amplifier (in which case it may be followed by a balun) or as a single-ended driver (in this case, the balun may be positioned before the PPA_VGA2 368). Furthermore, in alternative embodiments, the PPA_VGA2 368 amplification may also be achieved by either scaling a bias current or using a cascode structure. A second matching network 369 may provide further impedance matching to the transceiver load. The second matching network 369 may include the balun if the PPA-VGA2 369 is implemented as a differential amplifier. An output of the second matching network 369 may be provided to a power amplifier to amplify the signal to a level compatible for transmission.

Figure 3D:
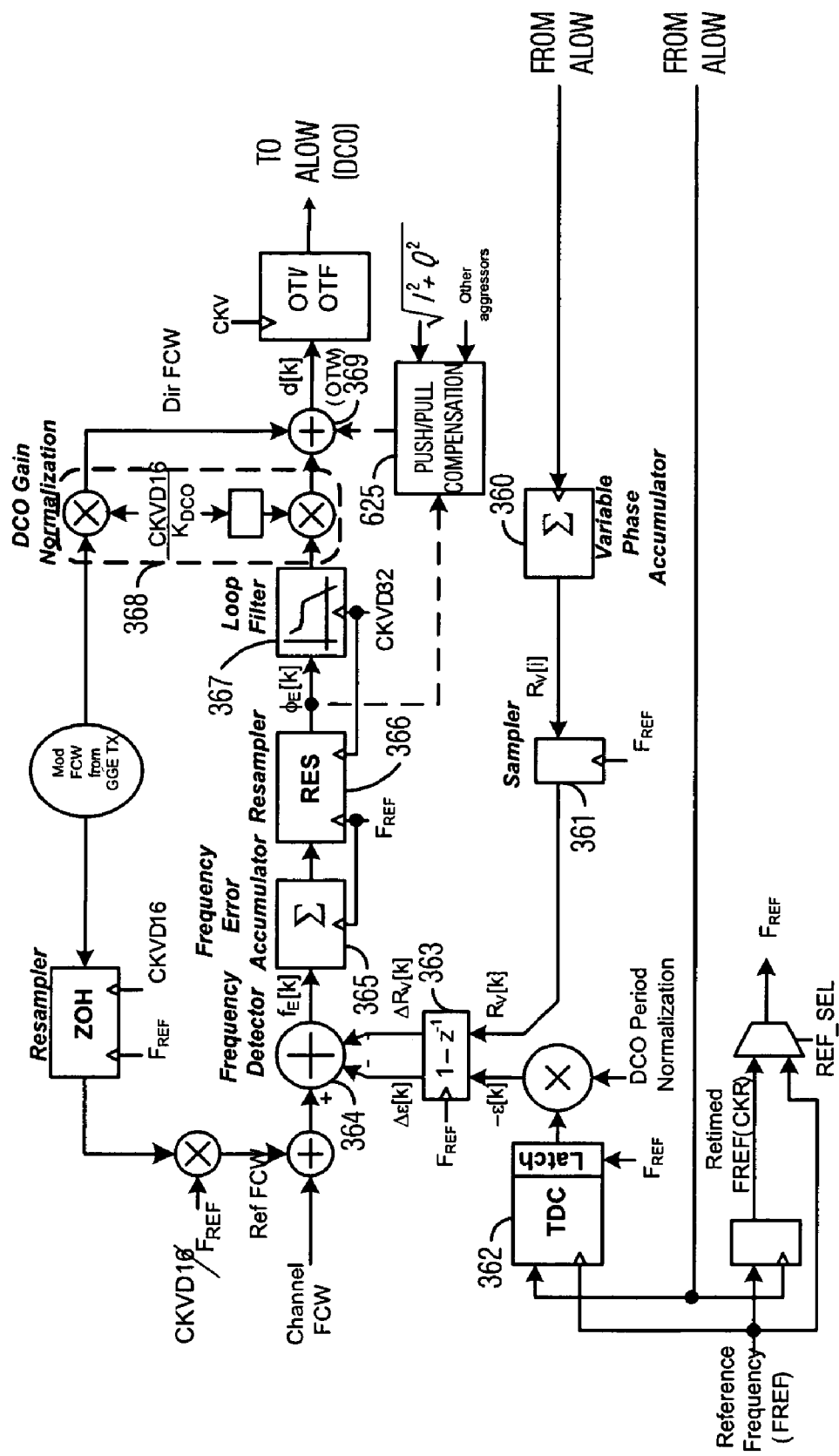
FIG. 3d is a diagram of a digital local oscillator block.

FIG. 3d illustrates a block view of the digital local oscillator block 315. The digital local oscillator block 315 may generate frequency control signals that may be used to control the generation of reference RF signals by the digitally-controlled analog local oscillator block 320. The digital local oscillator block 315 may control the generation of the reference RF signals by providing a frequency control words (FCW) (called OTW in block diagram after appropriate scaling) to a digitally controlled oscillator (DCO) of the analog local oscillator block 320. The FCW may be related to an expected value of a reference RF signal ($E(f_v[k])$) and a reference frequency ($f_R$) by a mathematical relationship expressible as:

$$FCW[k] = \frac{E(f_v[k])}{f_R}.$$

The FCW may be time variant and may be allowed to change with every cycle of the reference frequency. Please refer to U.S. Pat. No. 7,145,399, entitled "Type-II All Digital Phase Locked Loop (PLL)," issued Dec. 5, 2006, which is incorporated herein by reference, for a detailed description of the operation of the digital local oscillator block 315.

A variable phase accumulator 360 may determine a variable phase $R_v[i]$ by counting a number of clock transitions of the DCO clock, which, in turn, may be sampled by a sampler 361 to produce a sampled variable phase $R_v[k]$, wherein k is the index of the edge activity. The sampled variable phase may then be fixed-point concatenated with an output ($\epsilon[k]$) of a time-to-digital converter (TDC) 362. The TDC 362 may measure and quantize time differences between a frequency reference FRLF and the DCO clock. A sampled differentiated (by way of differentiator 363) variable phase may be subtracted from the FCW by a digital frequency detector 364. Frequency error samples $f_E[k]$=FCW−[($R_v[k]$−$\epsilon[k]$])−($R_v[k-1]$−$\epsilon[k-1]$)] may be accumulated by a frequency error accumulator 365 and sampled by a resampler 366 to create phase error samples $\phi_E[k]$ samples.

The phase error samples may then be filtered by digital loop filter 367, which may include infinite impulse response (IIR) and proportional-integral (PI) filters. The digital loop filter 367 may be a fourth-order filter, for example. The digital loop filter 367 provides a proportional and integral gain normalization, which may help to suppress DCO phase noise, while a push/pull compensation block 325 may apply frequency push/pull compensation to compensate for aggressors, such as an amplitude of the transmitted signal (SQRT ($I^2+Q^2$)) as well as other aggressors. The frequency push/pull compensation may be applied through adder 369. Collectively, the frequency detector 364, the frequency error accumulator 365, the resampler 366, the loop filter 367, and the DCO gain normalization block 368 may be referred to as being a part of a feedforward path of the digital oscillator block 315.

FIG. 3e illustrates a block view of the analog local oscillator block 320. The analog local oscillator block 320 may generate reference RF signals and includes a digitally controlled oscillator (DCO) 380 that may be controlled by the OTW provided by the digital oscillator block 315. The DCO 380 may generate an RF signal, whose frequency may be proportional to the OTW. The analog local oscillator block 320 also includes a divider circuit 382 for generating high and low band reference RF signals as well as RF signals at different phases for the I and Q quadrature phases.

DC and lower frequency components within the bandwidth of the ADPLL loop may be mitigated by the PLL itself. However, relatively higher frequencies (or sharp transitions) due to frequency pushing/pulling of aggressors may have a significant impact on transmitter performance characteristics, including but not limited to phase trajectory error, error vector magnitude, modulation spectrum, and so forth.

Figure 1:
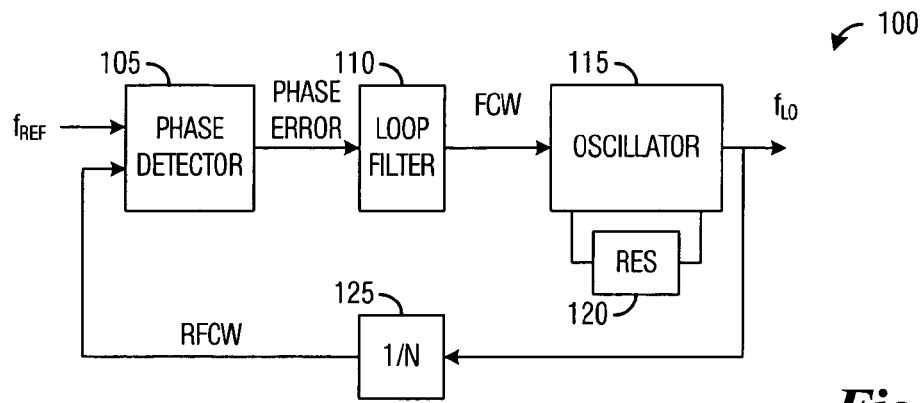
FIG. 1 is a diagram of a prior art oscillator.
Figure 2:
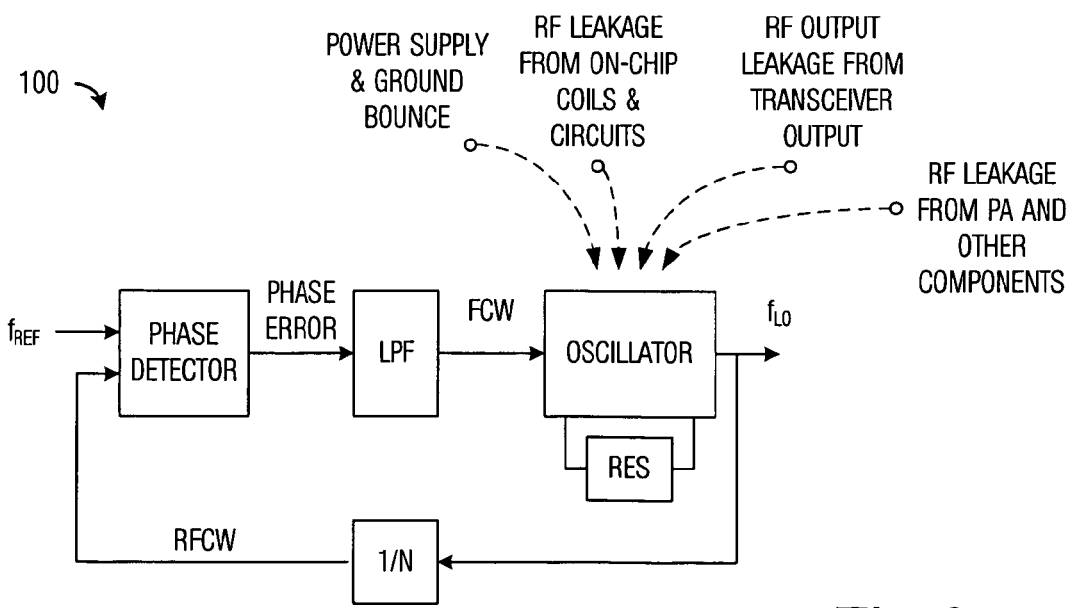
FIG. 2 is a diagram of potential sources of aggressors.

FIG. 2 illustrated several possible sources of aggressors capable of causing frequency pushing/pulling. Another potential aggressor may be the signal being transmitted by the transmitter itself. The signal being transmitted by the transmitter (in the form of radiated RF energy) may be picked up by the oscillator. The radiated RF energy at a variety of RF frequencies, such as RF low, RF high, as well as multiples thereof (harmonics), for example, may be picked up by the oscillator of the transmitter. The radiated RF energy may have a signal envelope that is a time variant function of the signal being transmitted by the transmitter.

As a magnitude of the radiated RF energy changes, a corresponding change in a current picked up by the oscillator is also seen. As the current changes, a change in the voltage level provided by a voltage supply of the transmitter is also seen. The change in the voltage level provided by the voltage supply may result in a change in signals produced by the oscillator. Therefore, in addition to directly detecting aggressors, it may also be possible to compute or derive the effect of aggressors by estimating the signal envelope of the signal being transmitted by the transmitter. The signal envelope may then be used to compensate for frequency pushing/pulling.

Although the discussion focuses on a transmitter of a wireless communications device, the embodiments discussed herein may also be applied to a receiver of a wireless communications device. For example, in an application wherein a wireless communications device is operating in a full duplex mode, such as with 3G communications standards, an output of a power amplifier or an on-chip power amplifier driver, such as a PPA, may potentially pull a PLL used in the receiver. When used in such an application, the frequency push/pull compensation may still utilize measured amplitudes of signals produced by the transmitter in the compensation.

Figure 4A:
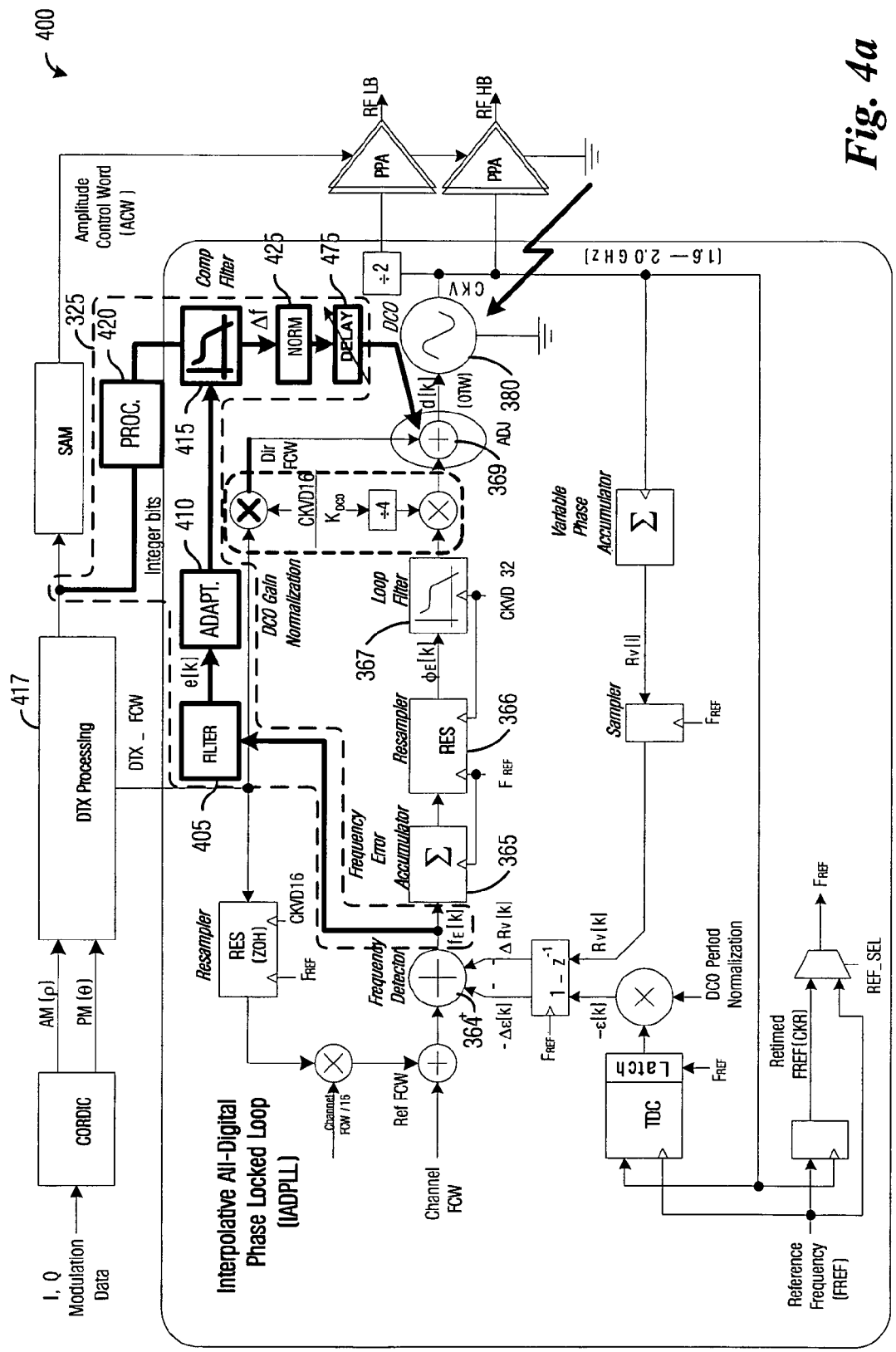
FIG. 4a is a diagram of a polar transmitter, wherein the transmitter includes a frequency push/pull compensation block.

FIG. 4a illustrates a transmitter 400. As shown in FIG. 4a, the transmitter 400 may be a polar transmitter. The transmitter 400 includes a frequency push/pull compensation block 325 to provide for compensation of disturbances in an output of the DCO 380 due to aggressor(s), such as aggressors arising from RF leakage of the transmitted signal at a power amplifier or a pre-power amplifier or coupling from other on-chip circuits. Since the aggressor(s) may impact the output of the DCO 380, the impact on the output of the DCO 380 may also be present in a feedback signal generated from the output of the DCO 380 as well as the frequency or phase error signal generated in part from the feedback signal. Therefore, analysis of the frequency or phase error signal may be utilized to provide compensation for the aggressor(s).

The frequency push/pull compensation block 325 includes a filter 405 that may be used to optionally filter a frequency or phase error signal. The filter 405 may be used to eliminate or reduce high frequency noise and may be implemented as a low pass filter. The frequency or phase error signal may or may not be filtered by the filter 405 depending on a level of the high frequency noise and a tolerance to the high frequency noise.

In the presence of aggressor(s) causing disturbance to an output of the DCO 380, the impact of the disturbance may be observable in a raw phase trajectory of the DCO 380. The DCO's phase trajectory may be observed after a phase detector of an interpolative ADPLL (IADPLL) or a dedicated high-quality phase detection mechanism. Frequency domain components of the DCO's phase trajectory may show degradation due to disturbances from the amplitude and phase of the aggressor(s). A goal of the frequency push/pull compensation block 325 is to minimize the cross-correlation of a raw oscillator phase error (or raw oscillator frequency error) with the amplitude of the aggressor(s). When the IADPLL settles, the raw phase error should be orthogonal to the amplitude of the aggressor(s) coupling into the DCO 380.

Figure 5A:
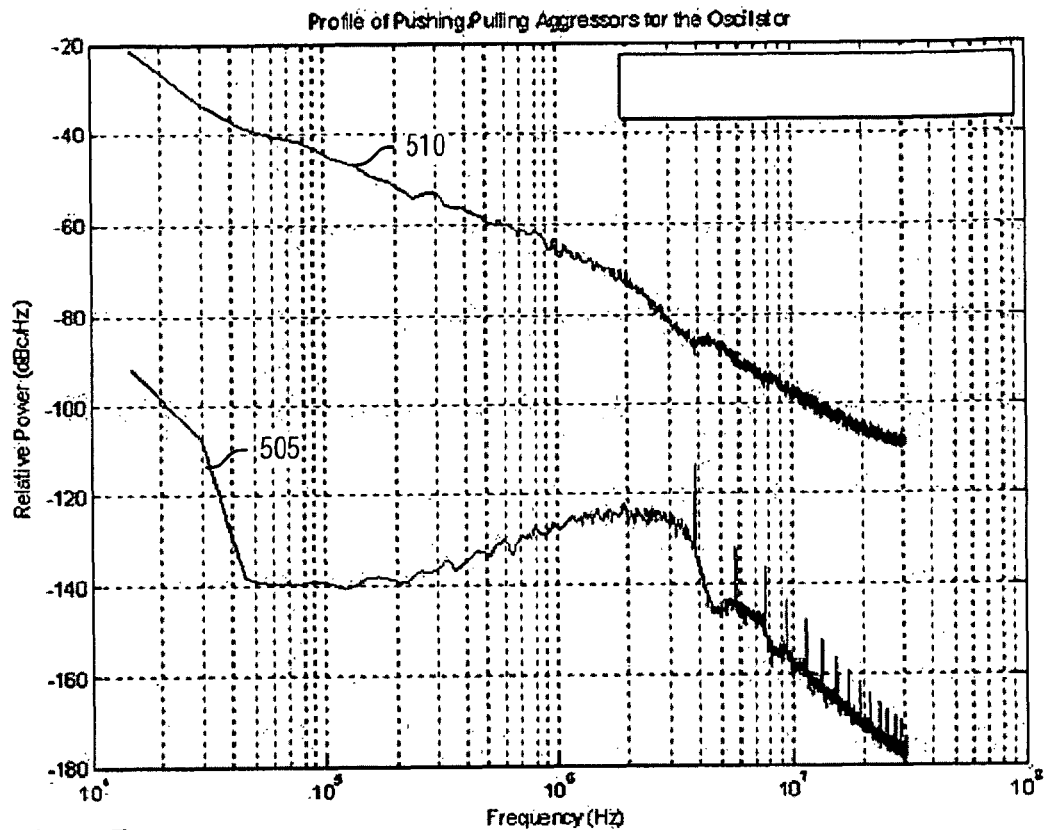
FIGS. 5a through 5d data plots of results from a simulation study of frequency push/pull compensation.

FIG. 5a is a data plot illustrating a relative magnitude of pushing and pulling aggressors used in a simulation study. The simulation study involves a WCDMA TX with a local oscillator being pushed and pulled. A first curve 505 represents a profile of an output of a power supply of a PPA, such as the PPA 365 or PPA 368, and a second curve 510 represents a profile of an RF signal. The output of the power supply (the first curve 505) may push the local oscillator's frequency, while the RF signal (the second curve 510) may pull the local oscillator's frequency.

Figure 5B:
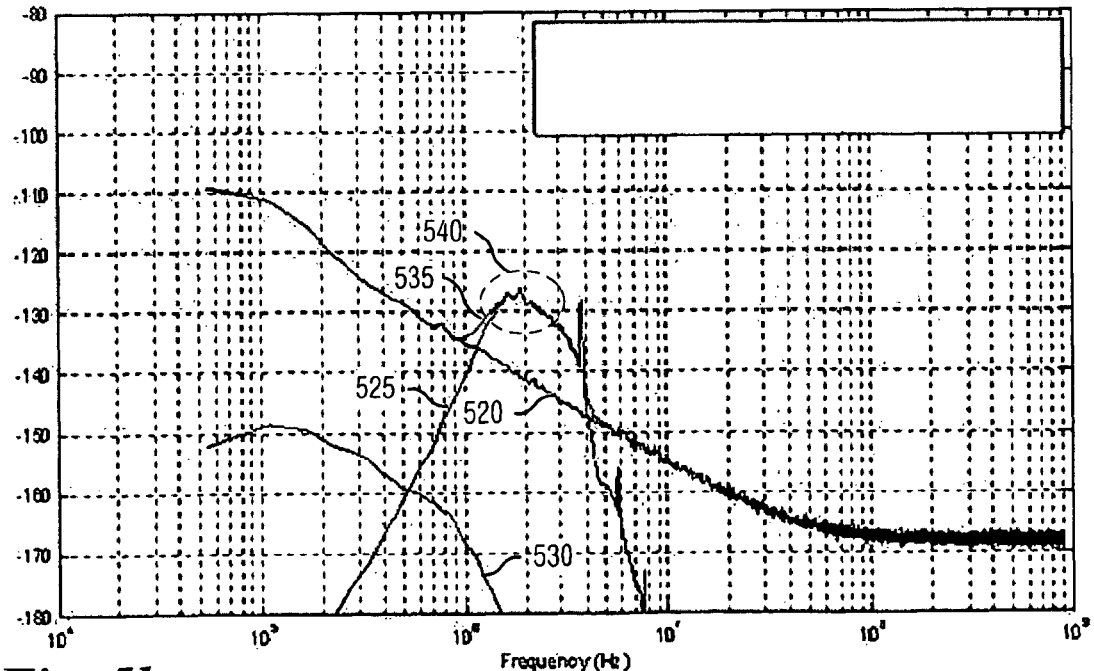

FIG. 5b is a data plot illustrating components of the local oscillator's noise in the presence of both pushing and pulling. In the simulation study, the local oscillator is operating at 1.8 GHz. However, the local oscillator may be operating at other frequencies. Therefore, the discussion of the local oscillator operating at 1.8 GHz should not be construed as being limiting to either the scope or the spirit of the embodiments.

As shown in FIG. 5b, a third curve 520 represents a closed-loop phase response of the local oscillator without pushing or pulling, a fourth curve 525 represents a closed-loop phase response of the local oscillator due to pushing, a fifth curve 530 represents a closed-loop phase response of the local oscillator due to pulling, while a sixth curve 535 represents a total close-loop phase response of the local oscillator due to both pushing and pulling. A strong bump (shown as highlight 540) at about 2 MHz frequency offset from a carrier frequency may be undesirable and may need to be removed (or reduced) in order for the WCDMA TX to be compliant to technical specifications.

Figure 5C:
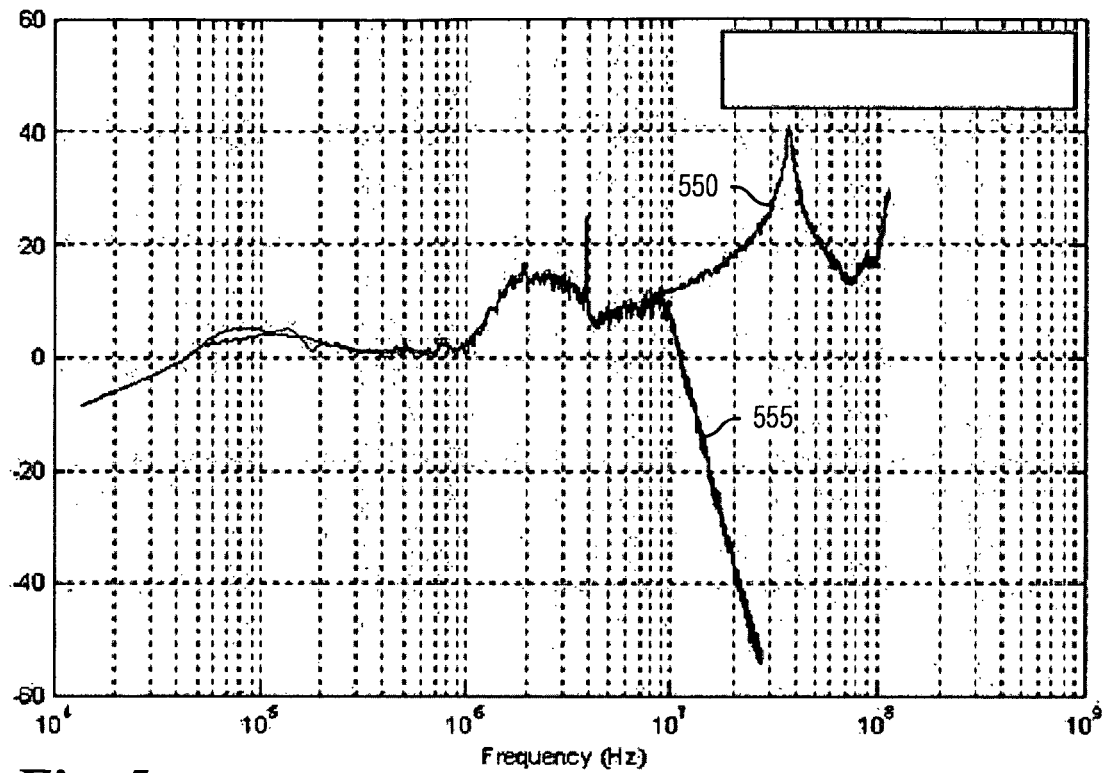

In the simulation study, to mitigate the aggressors, the output of the local oscillator was divided and then provided to a one-bit phase detector (PD). After the one-bit PD, the signal was filtered a low-pass filter with a corner frequency of about 7 MHz. FIG. 5c is a data plot illustrating an unfiltered output signal of the one-bit PD (shown as a sixth curve 550) and a filtered output signal of the one-bit PD (shown as a seventh curve 555).

The filtered output of the one-bit PD, together with an amplitude signal of the WCDMA TX, may be used to estimate a transfer function between the WCDMA TX and the local oscillator's phase noise (or error noise). The estimation may be performed using LMS adaptation to estimate filter coefficients of a compensation filter, for example. Using the filter coefficients of the compensation filter, the amplitude signal of the WCDMA TX may be filtered, time aligned, and then eliminated (subtracted) from the local oscillator's tuning word. This may be performed after normalization, wherein the normalization may include scaling for WCDMA TX's output power, as well as scaling for the local oscillator's varactor tuning slope, and so forth.

Figure 5D:
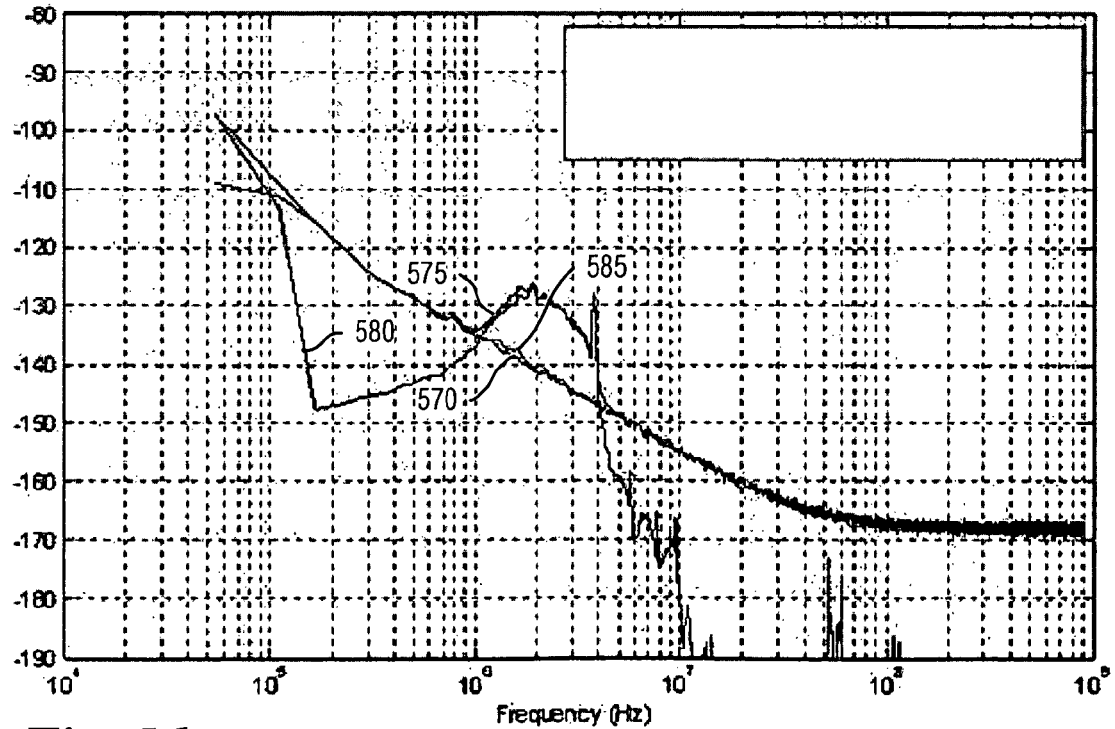

FIG. 5d is a data plot illustrating the results of aggressor mitigation. An eight curve 570 represents the phase response of the local oscillator without pushing or pulling, a ninth curve 575 represents the phase response of the local oscillator with pushing and pulling, a tenth curve 580 represents a compensation signal generated from the amplitude signal of the WCDMA TX, and an eleventh curve 585 represents the phase response of the local oscillator with pushing and pulling after pushing/pulling cancellation.

As shown in FIG. 5d, undesired phase noise caused by the pushing/pulling may be substantially eliminated by pushing/pulling cancellation. The phase response of the local oscillator after pushing/pulling cancellation (the eleventh curve 585) is about equal to the phase response of the local oscillator without pushing or pulling (the eight curve 570). There may be less than 0.4 dB degradation in phase noise at around 2 MHz frequency offset.

The embodiments pushing/pulling cancellation techniques and methods discussed herein may become operational concurrently with other closed loops contributing to the transmit path of a transmitter, including a (all digital) frequency synthesis PLL, power control, predistortion adaptation, and so forth. In order to assist in the faster settling of the pushing/pulling cancellation, a loop bandwidth of other closed loops may be adjusted (narrowed or widened). This may also be applicable for other closed loops if they are performing delay alignment or pushing/pulling compensation.

As described above, even the loop bandwidth of the ADPLL may be adjusted to assist settling of the frequency push/pull compensation block 325. In order for other closed loops in the transmit path of the transmitter to have controllable loop bandwidths, they may need to be implemented with programmable filters. The programmable filters may need to be further implemented so that a shifting operation used to change the loop bandwidth (if needed) causes no (or substantially no) glitch to appear at the output of the respective closed loop. Please refer to co-assigned U.S. patent application entitled "Digital Phase Locked Loop with Gear Shifting," filed Jun. 11, 2008, Ser. No. 12/137,332 for a detailed description of the shifting operation to change loop bandwidth.

Turning back to FIG. 4a, the frequency or phase error signal may be obtained at an output of the frequency detector 364 of an interpolative ADPLL (IADPLL). Alternatively, the frequency or phase error signal may be obtained at an output of the frequency error accumulator 365 or the resampler 366. The frequency or the phase error signal may also be obtained at an output of the loop filter 367, however, the filtering provided by the loop filter 367 may negatively impact the impact of the aggressor(s) present in the frequency or phase error signal. The loop filter 367 may undesirably attenuate or eliminate vital frequency components of the aggressor(s) presence, for example. In general, the frequency or phase error signal may be obtained at a variety of points in a feedforward path of the IADPLL as long as the aggressors have not been attenuated or eliminated by circuitry in the feedforward path. Additionally, there may be other sources that may be used as the frequency or phase error signal. These sources may include an output of a receiver, an auxiliary receiver, an especially dedicated partial receiver, and so forth. Furthermore, an error signal other than the frequency or phase error signal may be used.

An adaptation block 410 may be used to characterize the aggressor(s) present in the frequency or phase error signal, i.e., the adaptation block 410 may be used to compute a transfer characteristics (such as filter coefficients) of the aggressor(s). For example, a phase error signal may be compared with the aggressor(s) signal to determine the transfer characteristics of the aggressor(s). Alternatively, an additional circuit may be used to measure a phase variation with the frequency push/pull for the purpose of determining the transfer characteristics. If the frequency push/pull has a relatively constant shape as the gain varies in different chips, the shape may be obtained using the additional circuit or through laboratory measurements of exemplary chips. The adaptation block 410 may implement an appropriate adaptation algorithm, such as a gradient-based algorithm such as an least mean squared (LMS) algorithm or its variants, a stochastic gradient, any parametric tracking filter configuration such as least squares, Kalman filtering, etc., and so forth. The transfer characteristics of the aggressor(s), such as filter coefficients, may be provided to a compensation filter 415. The compensation filter 415 may make use of the transfer characteristics computed by the adaptation block 410 to compute a frequency push/pull correction term, $\Delta f$. The frequency push/pull correction term may be a negative frequency corresponding to the frequency push/pull. The compensation filter 415 may be implemented as a look-up table (LUT), a finite impulse response (FIR) filter, an infinite impulse response (IIR) filter, a polynomial, or so on.

The frequency push/pull correction term may be computed from a transmitted signal obtain from a transmit signal path, such as at an output of a digital transmission processing block 417. The transmitted signal may undergo processing, such as a computation of an amplitude of the transmitted signal ($SQRT(I^2+Q^2)$), by a processing block 420. The frequency push/pull correction term may be normalized by a normalizer 425. The normalizer 425 may normalize the frequency push/pull correction term with a gain of the DCO, KDCO, and a transmit power. Additionally, the normalizer 425 may convert the frequency push/pull correction term into a digital control word for use in adjusting the DCO 380. The normalized frequency push/pull correction term may then be applied to the DCO 380 after it may have been adjusted for appropriate timing alignment with the aggressor. The normalized frequency push/pull correction term may then be delay aligned with the aggressor(s) by way of a delay block 475 and applied to the DCO 380. The delay block may be tuned for improved cancellation of DCO frequency pushing/pulling. Alternatively, the normalizer 425 may perform the delay alignment to align the normalized frequency push/pull correction term with the aggressor(s).

Figure 4B:
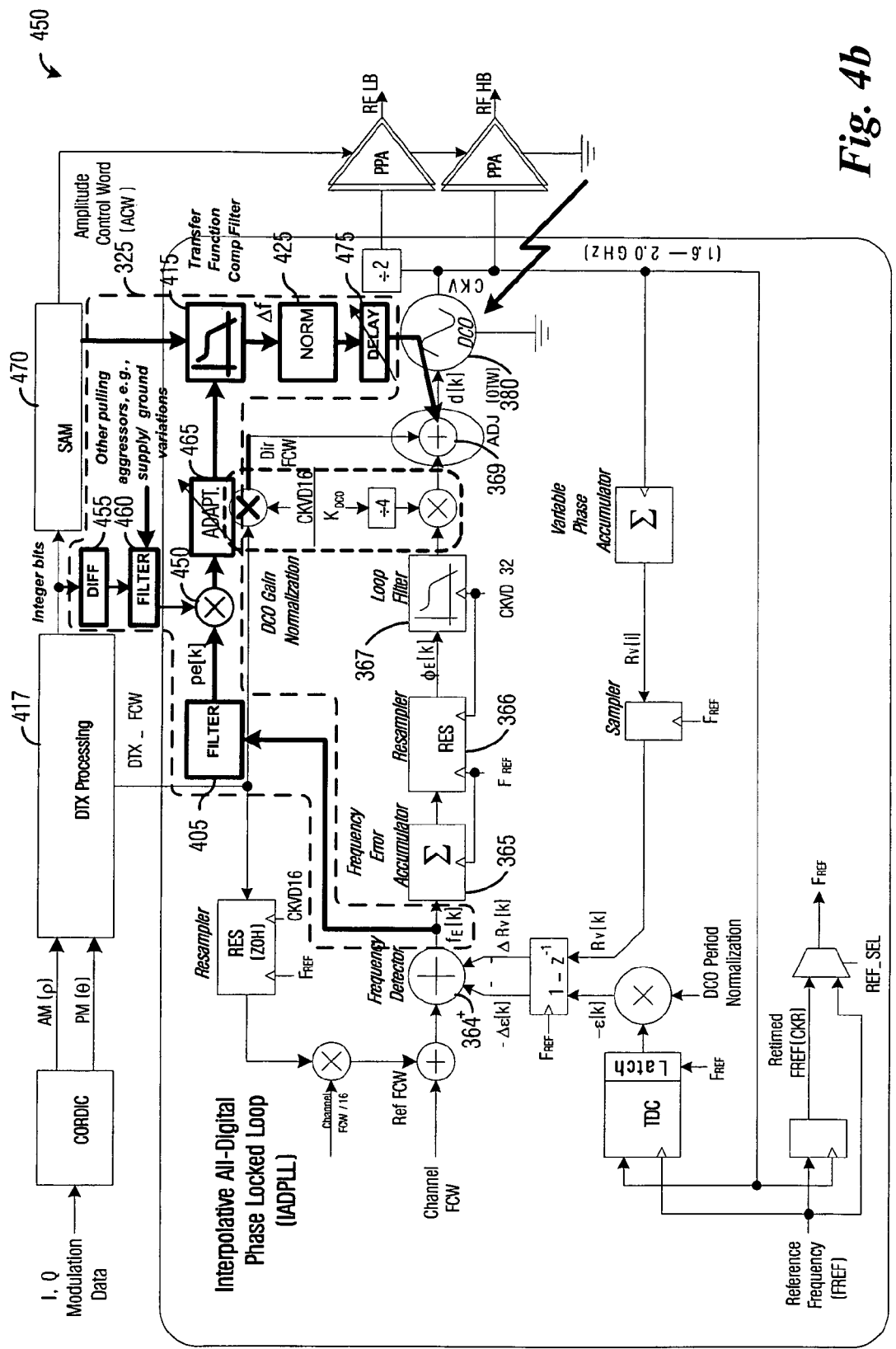
FIG. 4b is a diagram of a polar transmitter, wherein the transmitter includes a frequency push/pull compensation block.

FIG. 4b illustrates a transmitter 450. As shown in FIG. 4b, the transmitter 450 may be a polar transmitter. The transmitter 400 includes a frequency push/pull compensation block 325 to provide for compensation of disturbances in an output of the DCO 380 due to aggressor(s), such as aggressors arising from RF leakage of the transmitted signal at a power amplifier or pre-power amplifier, RF leakage from on-chip coils and circuits, and so forth.

The frequency push/pull compensation block 325 includes a filter 405 that may be used to optionally filter a frequency or phase error signal. The filter 405 may be used to eliminate or reduce high frequency noise and may be implemented as a low pass filter. The frequency or phase error signal may or may not be filtered by the filter 405 depending on a level of the high frequency noise and a tolerance to the high frequency noise.

As shown in FIG. 4b, the frequency or phase error signal may be obtained at an output of the frequency detector 364. Alternatively, the frequency or phase error signal may be obtained at an output of the frequency error accumulator 365 or the resampler 366. The frequency or the phase error signal may also be obtained at an output of the loop filter 367, however, the filtering provided by the loop filter 367 may negatively impact the nature of the aggressor(s) present in the frequency or phase error signal. The loop filter 367 may attenuate or eliminate portions of the aggressor(s), for example.

Unlike the frequency push/pull compensation block 325 of FIG. 4a, the frequency push/pull compensation block 325 computes an error gradient, which may be a weighted sum of the aggressor(s) and the frequency or phase error signal. The error gradient may be computed by combining (at adder 450) the frequency or phase error signal (with or without filtering by the filter 405) with a differentiated (differentiator 455) and filtered (filter 460) transmitted signal obtained from a transmit signal path, such as at an output of the digital transmission processing block 417. The error gradient may also be computed from amplitude control words (ACW) from the transmit signal path or phase error (PHE) signals from the IADPLL. Separate filters (the filter 405 for the frequency or phase error signal and the filter 460 for the aggressor(s)) may allow for delay alignment and/or signal smoothening by eliminating high frequency error.

The error gradient may then be provided to an adaptation block 465 that may be used to characterize the aggressor(s) present. In addition, the adaptation block 465 may provide a delay alignment signal to the filters 405 and 460 to perform delay alignment. The transfer characteristics of the aggressor(s) may be provided to the compensation filter 415, which may make use of the transfer characteristics to compute the frequency push/pull correction term. The frequency push/pull correction term may be a negative frequency corresponding to the frequency push/pull. The compensation filter 415 may be implemented as a look-up table (LUT), a finite impulse response (FIR) filter, a polynomial, or so on.

The frequency push/pull correction term may be computed from a transmitted signal obtained from the transmit signal path, such as from a sigma-delta amplitude modulator (SAM) 470. The frequency push/pull correction term may be normalized by the normalizer 425. The normalizer 425 may normalize the frequency push/pull correction term with a gain of the DCO, KDCO, and a transmit power). The normalized frequency push/pull correction term may then be delay aligned with the aggressor(s) by way of the delay block 475 and applied to the DCO 380. The delay block may be tuned for improved cancellation of DCO frequency pushing/pulling.

Figure 4C:
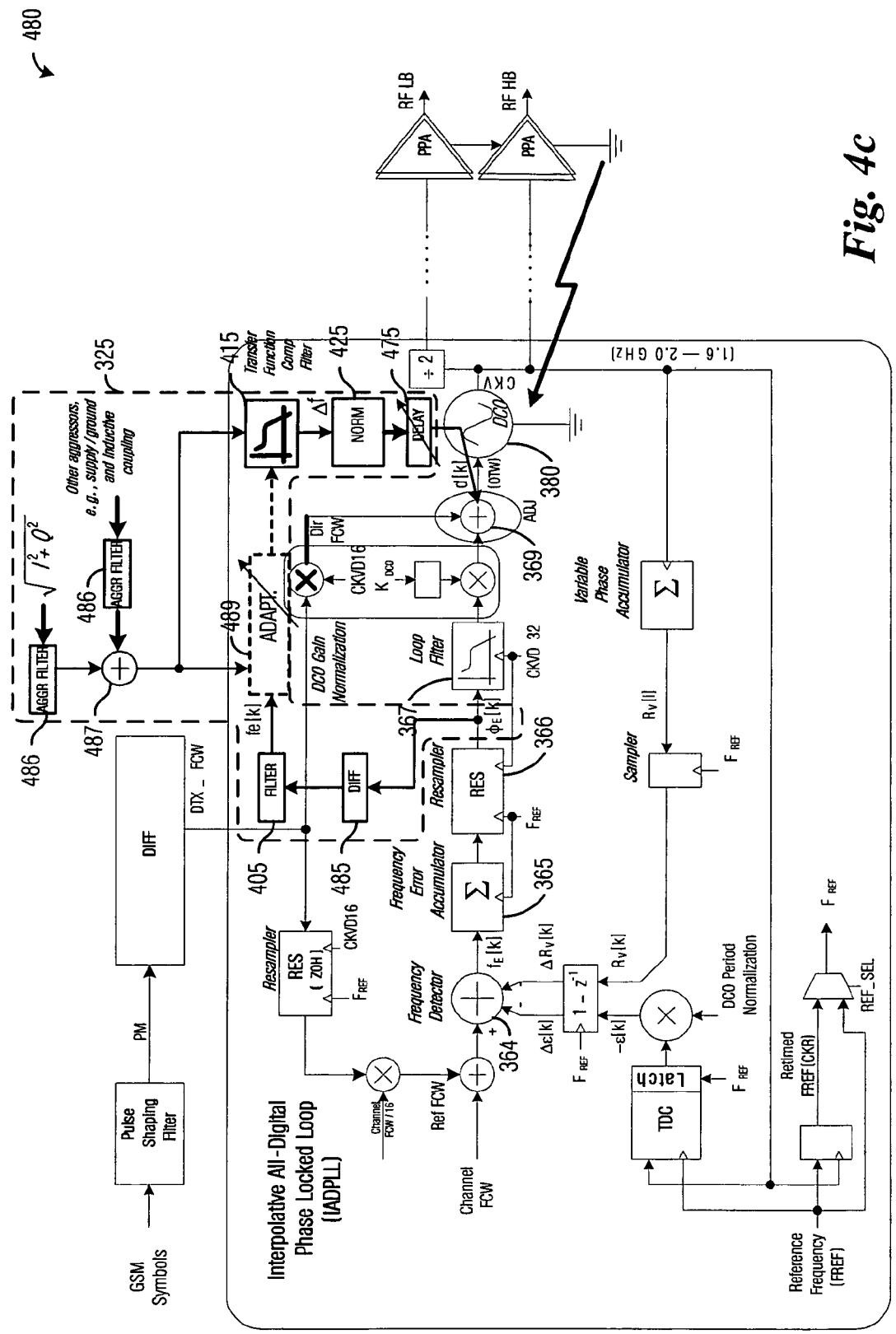
FIG. 4c is a diagram of a Cartesian transmitter, wherein the transmitter includes a frequency push/pull compensation block.

FIG. 4c illustrates a transmitter 480. As shown in FIG. 4c, the transmitter 480 may be a Cartesian transmitter with an IADPLL capable of modulating the oscillator (e.g., for modulations such as GSM). Unlike a polar transmitter, such as transmitters 400 and 450, which modulates a phase angle of its oscillator and then compute transmitted signal by amplitude modulation of the phase modulated carrier. A Cartesian transmitter may modulate in quadrature an unmodulated local oscillator such as derived from the output of the DCO 380. A straight forward change to the frequency push/pulling compensation technique used for a polar transmitter may be utilized to enable frequency push/pulling compensation for a Cartesian transmitter.

The frequency push/pull compensation block 325 may obtain a frequency or phase error signal from an output of the resampler 366. Alternatively, the frequency or phase error signal may be obtained at an output of the frequency detector 364 or the frequency error accumulator 365. The frequency or the phase error signal may also be obtained at an output of the loop filter 367, however, the filtering provided by the loop filter 367 may negatively impact the impact of the aggressor(s) present in the frequency or phase error signal. The loop filter 367 may attenuate or eliminate portions of the impact of the aggressor(s), for example. If a phase error signal is used by the frequency push/pull compensation block 325, a differentiator 485 may be used to convert the phase error signal to a frequency error signal. The filter 405 may be used to eliminate or reduce unwanted frequency content of this consequence signal.

An error gradient may be computed from the amplitude of the transmitted signal ($SQRT(I^2+Q^2)$) or other potential aggressor(s), such as a frequency of a switched mode power supply, baseband/digital clocks, power level, and so forth. Each of the aggressors may be pre-conditioned using an aggressor filter 486. The aggressor filter 486 may be a frequency selective filter, bias removal circuit, etc., for example. The frequency error filter 405 as well as the aggressor filter 486 may be selectively tuned to maximize resolution or sensitivity to each aggressor. In the case of multiple aggressors, separate gradient terms may be computed for each aggressor and feedback combination. A summing point 487 may combine the individual aggressor gradients to determine a composite error gradient. In an alternative embodiment, the frequency selective filtering of all the aggressors may be shared by first summing the weighted aggressors and then using a common filter. In this case, the final gradient may be computed directly between the composite aggressor and the filtered frequency error signal.

An adaptation block 489 may be used to characterize the aggressor(s) present in the frequency or phase error signal, i.e., the adaptation block 489 may be used to compute a transfer characteristics (such as filter coefficients) of the aggressor(s). For example, a phase error signal may be compared with the aggressor(s) signal to determine the transfer characteristics of the aggressor(s). The adaptation block 489 may implement an appropriate adaptation algorithm, such as a gradient-based algorithm such as an least mean squared (LMS) algorithm or its variants, a stochastic gradient, any parametric tracking filter configuration such as least squares, Kalman filtering, etc., and so forth. The adaptation block 489 may be performed on-chip or off-chip. If performed on-chip (placed on a substrate also containing the transmitter 480), using built-in hardware and/or software resources available on the transmitter 480. If performed off-chip (placed on a different substrate or package from the transmitter 480), direct measurement of phase or frequency error may not be possible, therefore, examination of the transmitted signal and the output of the DCO 380 may be required in adaptation. Off-chip adaptation may be performed during calibration, for example.

Additionally, the adaptation block 489 may be able to perform delay alignment to align the aggressor(s) and the frequency or phase error signal. The transfer characteristics of the aggressor(s) and the aggressor(s) (along with transmitted data) may be provided to the compensation filter 415, which may make use of the transfer characteristics of the aggressor(s) to compute the frequency push/pull correction term. The frequency push/pull correction term may be a negative frequency corresponding to the frequency push/pull. The compensation filter 415 may be implemented as a look-up table (LUT), a finite impulse response (FIR) filter, a polynomial, or so on. The frequency push/pull correction term may be computed as a function of the aggressor(s) and may then be normalized by the normalizer 425. The delay unit 475 may perform delay aligning of the frequency push/pull correction term with the aggressor(s) prior to providing the frequency push/pull correction term to the DCO 380.

The estimation of the transfer characteristics of the aggressor(s) may be performed on-chip using available hardware and/or software resources. Alternatively, the estimation may be performed using off-chip resources during system calibration, for example. If the estimation is performed off-chip, dynamic scaling of the transfer characteristics may still need to be performed on-chip and dynamically. Additionally, a measurement of the waveform of the aggressor(s) may be performed in a built-in self test (BIST) like manner or it may utilize auxiliary on or off chip components.

Figure 6:
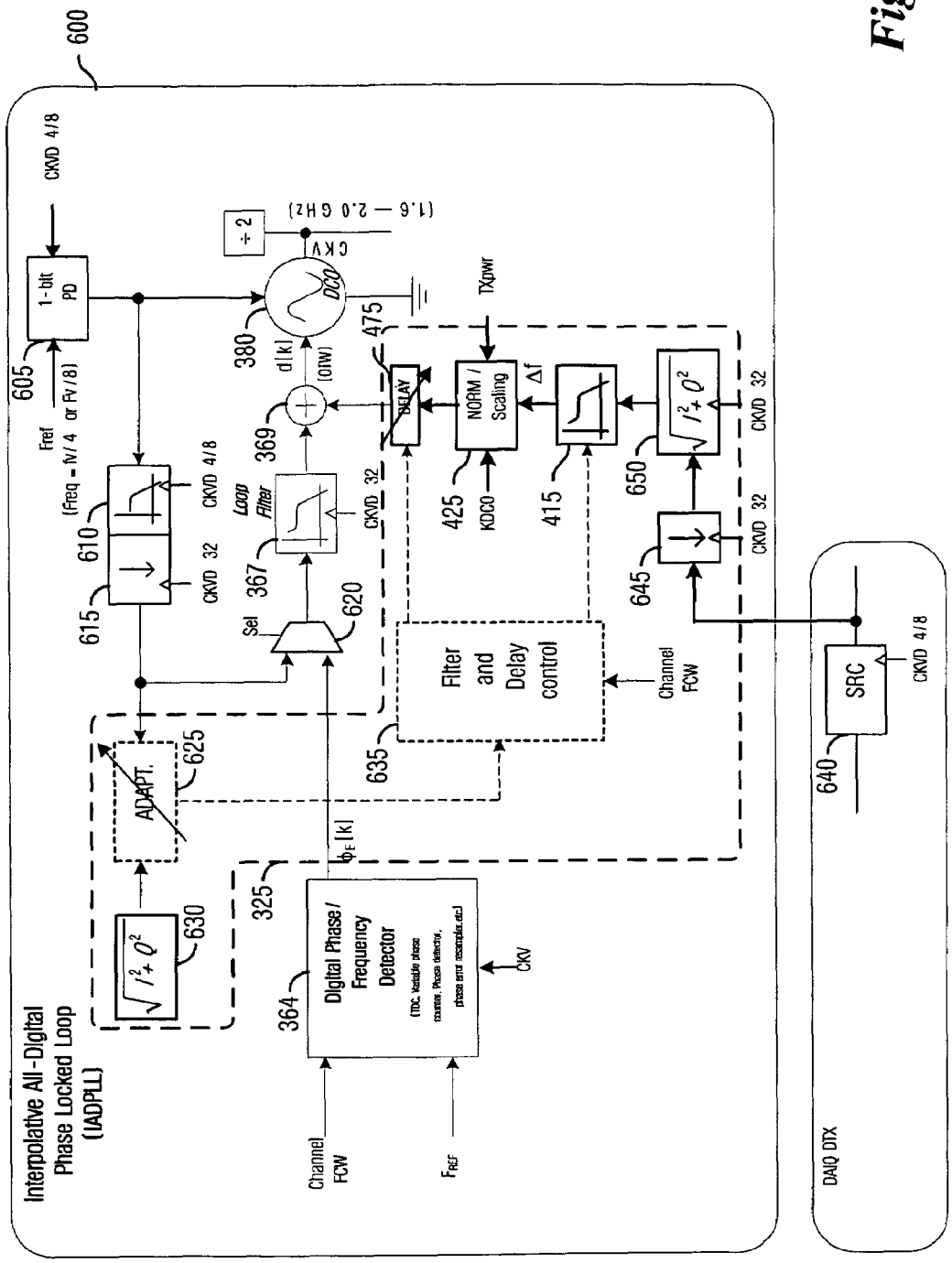
FIG. 6 is a diagram of a transmitter, wherein the transmitter includes a frequency push/pull compensation block with an alternate error signal detection circuit.

In some situations, the perturbation caused by the frequency pushing/pulling to the output of the DCO 380 may be small when compared to the resolution of the TDC 362. In such a situation, a phase error signal may do not provide enough signal-to-noise ratio to adequately characterize the aggressors. This may be mitigated either by the use of a high-resolution TDC architecture in the IADPLL or alternately implementing an auxiliary high-resolution feedback digitization circuit. FIG. 6 illustrates an IADPLL 600, wherein the IADPLL 600 includes circuitry to allow for precise measurement of the frequency and the phase of the output of the DCO 380, which carries the information of the impact of the aggressors. A phase detector (PD) 605, which may be implemented as a one-bit phase detector, may be used to detect the phase of the DCO 380. As an example, the PD 605 may be operated at a frequency of about ¼-th or ⅛-th of the RF frequency provided by the DCO 380. Output of the PD 605 may be provided to the DCO 380 to correct the phase and/or frequency of the DCO 380.

Frequency information of the DCO 380 may then be obtained by filtering the output of the PD 605 with a filter 610. A downsampler 615 may be used to reduce the frequency information's data rate from about ¼-th or ⅛-th of the RF frequency provided by the DCO 380 to about 1/32-nd of the RF frequency. A multiplexer 620, controlled by a select signal line, may chose between an output of the frequency detector 364 (in the normal operation) or the downsampled frequency information of the DCO 380 (an output of the downsampler 615 in the calibration mode).

The downsampled frequency information of the DCO 380 may also be provided to an adaptation unit 625 of the frequency push/pull compensation block 325, which may make use of the downsampled frequency information and an amplitude of the transmitted signal (provided by block 630) to characterize the aggressor(s), producing transfer characteristics of the aggressor(s). As shown, the adaptation unit 625 may be capable of characterizing a variety of aggressors, including RF leakage from PA and/or PPA output, RF leakage from on-chip coil(s) and other circuits, power supply and ground bounce, on-chip electro-magnetic couplings and so forth. As discussed previously, the adaptation unit 625 may make use of a variety of adaptive algorithms including gradient-based algorithms such as least mean squared (LMS) algorithm or its variants, a stochastic gradient, any parametric tracking filter configuration such as least squares, Kalman filtering, etc., and so forth.

Output of the adaptation unit 625 (transfer characteristics of the aggressor(s)) may then be provided to a filter/delay control block 635. The filter/delay control block 635 may be used to provide the transfer characteristics of the aggressor(s) to the compensation filter 415 and control a delay of the delay unit 475 to align the frequency push/pull correction term with the aggressor(s).

A sample rate converter (SRC) 640 may be a resampling circuit that transforms the transmit baseband data from baseband clocks to LO-derived clock domains. SRC output may provide the transmitted data to the frequency push/pull compensation block 325, on the same clock domain as the feedback error signal. In an alternative embodiment without the SRC 640, a resampler may be introduced prior to compensation, due to a clock domain of the ADPLL 600 also being LO-derived. The transmitted data may be downsampled (by a downsampler 645) to a data rate compatible with the downsampled frequency information and the transfer characteristics of the aggressor(s), such as 1/32-nd of the frequency of the DCO 380. A magnitude unit 650 may compute a magnitude of the transmitted data, which may then be provided to the compensation filter 415.

Figure 7:
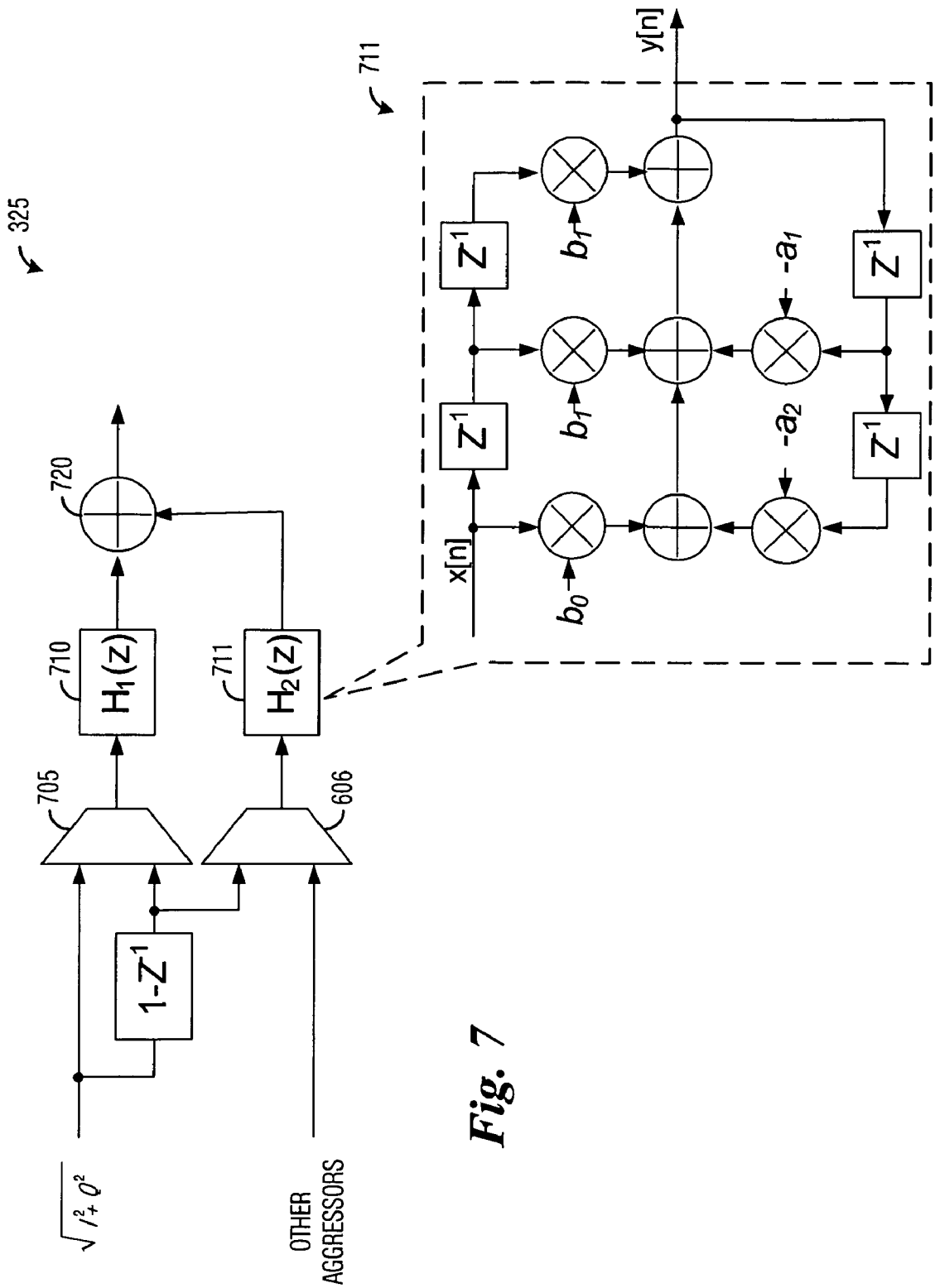
FIG. 7 is a diagram of a portion of a frequency push/pull compensation block.

FIG. 7 illustrates an example block diagram of a portion of the frequency push/pull compensation block 325. The portion of the frequency push/pull compensation block 325 shown in FIG. 7 includes the compensation filter 415 along with attendant circuitry for providing the aggressor(s) to the compensation filter 415 to compute the frequency push/pull correction term. The portion of the frequency push/pull compensation block 325 shown may be based on an assumption that the DCO push/pull compensation block 325 has a two-pole and two-zero transfer characteristic expressible as:

$$H(z) = \frac{b_0 + b_1 z^{-1} + b_2 z^{-2}}{a_0 + a_1 z^{-1} + a_2 z^{-2}}.$$

The frequency push/pull compensation block 325 may be readily modified for other desired transfer characteristics.

The frequency push/pull compensation block 325 includes a first multiplexer 705 usable to select between a magnitude of the transmitted data and a differentiated amplitude of the transmitted data. The frequency push/pull compensation block 325 also includes a second multiplexer 706 usable to select between the differentiated magnitude of the transmitted data and other aggressor(s). Outputs from the first multiplexer 705 and the second multiplexer 706 may be provided to a first filter 710 and a second filter 711, respectively.

FIG. 7 also displays a detailed view of the second filter 711, with a detailed view of the first filter 710 potentially being similar. Input to the second filter 711, the aggressor(s) or the differentiated amplitude of the transmitted data, may be multiplied by filter coefficients, such as coefficients $b_0$, $b_1$, $b_2$, $a_1$, $a_2$, and so forth. The filter coefficients may be determined a priori and stored for subsequent use or they may be determined dynamically by an adaptation block. The determining of the filter coefficients may be performed on-chip or off-chip and then stored. The outputs of the first filter 710 and the second filter 711 may then be combined (by adder 720, for example) to form the frequency push/pull correction term.

Figure 8A:
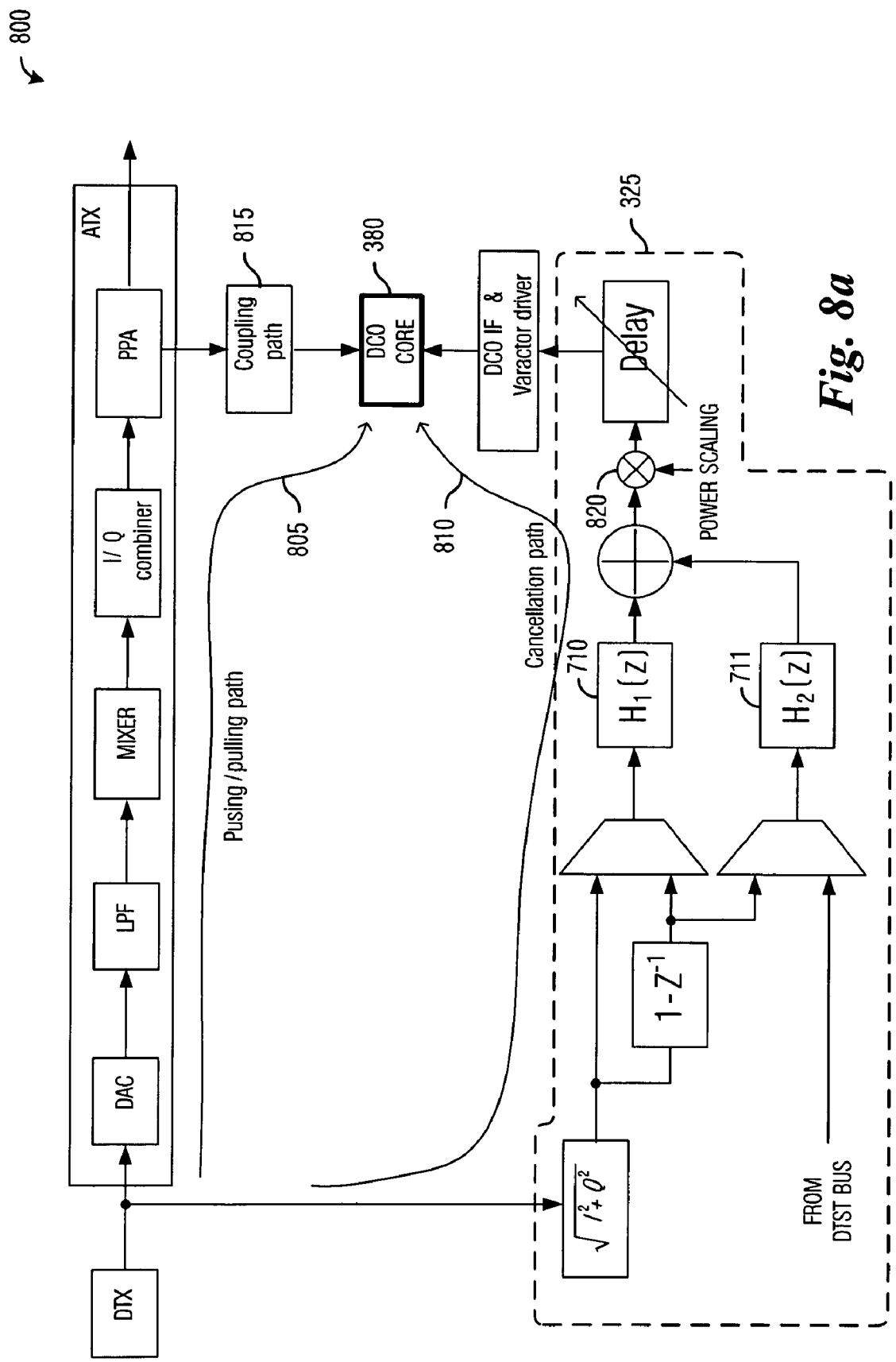
FIG. 8a is a diagram of a transmitter.

As discussed previously, the frequency push/pull correction term generated by the frequency push/pull compensation unit 325 may need to be properly time-aligned with the aggressor(s) to achieve desired frequency push/pull cancellation. FIG. 8a illustrates a high-level view of a transmitter 800, wherein a frequency push/pull path 805 and a frequency push/pull cancellation path 810 are highlighted. To achieve proper frequency push/pull cancellation, the frequency push/pull path 805 and the frequency push/pull cancellation path 810 should have substantially the same signal delay/latency.

Generally, a delay of a signal path may be dominated by a block/unit having a narrowest bandwidth. As shown in FIG. 8a, the delay of frequency push/pull path 805 may be dominated by a coupling path 815 where signals from a transmit path may be coupled onto signals being provided to the DCO 380. For the frequency push/pull cancellation path 810, the delay may be dominated by the compensation filters 710 and 711.

In addition to the delays introduced by the compensation filters 710 and 711, latency in digital circuits and varactor interface of the DCO 380, a propagation delay of the TX feedforward transmission path may contribute significantly to the delay tuning of the frequency push/pull cancellation path 810. These delays may need to be matched with the delays of the frequency push/pull path 805. To achieve this, the aggressor(s) may need to be obtained from an early stage of the frequency push/pull path 805 and the latency of the remainder of the frequency push/pull path 805 be slightly larger than the latency of digital circuitry in the frequency push/pull cancellation path 810. This may then allow for a difference in the delay of the two paths to be aligned using a delay tuning circuit.

The delay tuning circuit may be required to meet a resolution requirement that may be a function of the frequency push/pull strength and the signal bandwidth. For example, let the phase variation caused by frequency push/pull to be no more than 10 dB higher than the DCO's noise level with a bandwidth of 5 MHz. If a 0.5 dB noise degradation after frequency push/pull cancellation is permitted, then the required delay resolution may be computed as follows:

$$\text{relative\_error} = \frac{10^{(0.5/20)}-1}{10^{10/20}} = 0.0187,$$

then, with a delay resolution of Tres, the maximum relative error is expressible as:

$$\text{m\_relative\_error} = \frac{Tres}{Tbw} * 2 * \pi,$$

where Tbw is (1/bandwidth). If the relative error is caused by finite delay resolution, then:

$$\frac{Tres}{Tbw} * 2 * \pi = 0.0187 \Rightarrow Tres = Tbw/335.$$

Therefore, for a bandwidth of 5 MHz, the delay resolution is equal to (1/335*5 MHz)=(1/1.67 GHz), which may not be achievable with a digitally controlled delay clocked at 1/16-th of the frequency of the DCO 380, which may be on the order of (1/100 MHz).

In order to overcome this, the delay tuning may be achieved by using two stage delay tuning, a coarse delay tuning and a fine delay tuning. The coarse delay tuning may be performed using a digitally controlled delay stage clocked at 1/16-th of the frequency of the DCO 380 and the fine tuning may be performed by offsetting a clock overlap ratio used in the resampler 366.

In addition to delay tuning, the transmitter 800 also includes scaling unit 820 (shown in FIG. 8a as a multiplier) that may be used to scale the frequency push/pull correction term. The scaling may be controlled by a control signal or a control word, shown as "POWER SCALING," provided by a processor, a calculation unit, or so forth. For example, the control signal or control word may be provided to the scaling unit 820 by a processor based on a measurement of a magnitude of the transmitted signal, an estimated phase error at a specified frequency, or so on. The frequency push/pull correction term may then be scaled to substantially match the magnitude of the transmitted signal, the estimated phase error at a specified frequency, or so forth.

Figure 8B:
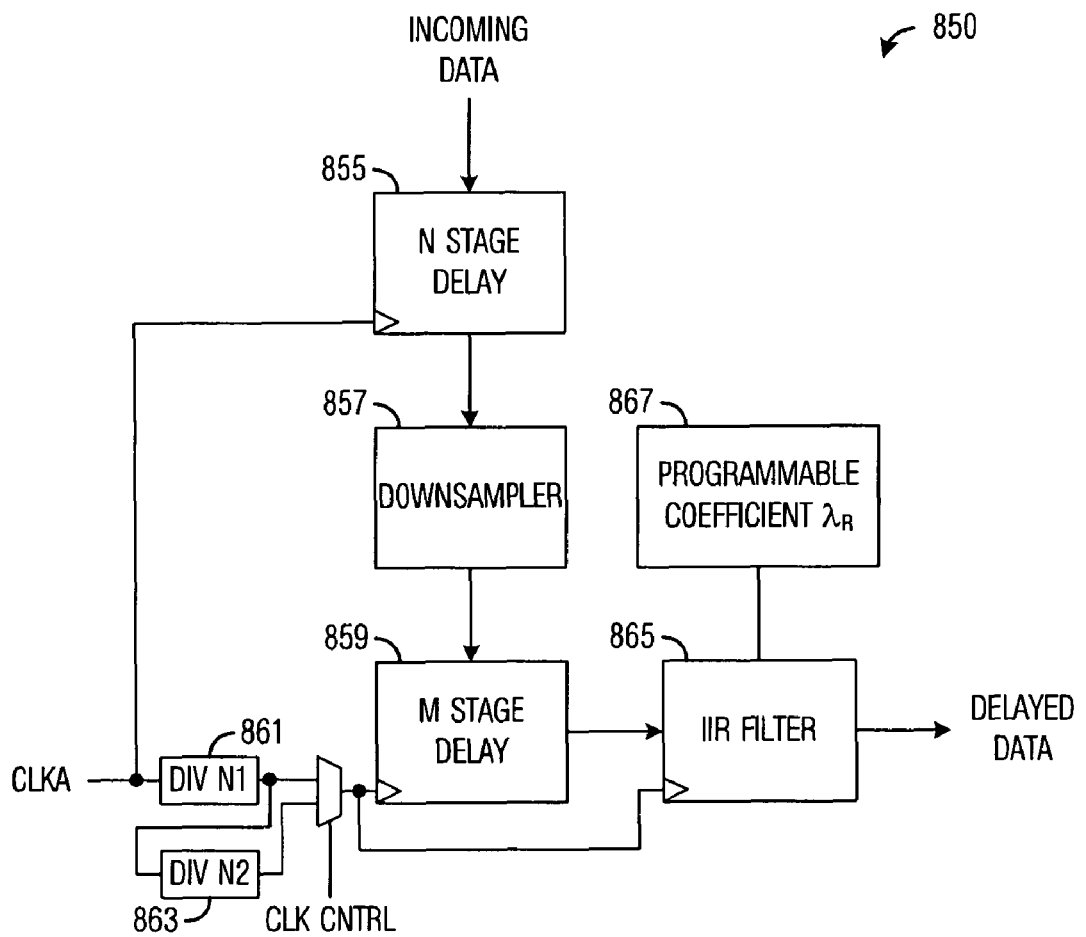
FIG. 8b is a diagram of a circuit for delaying incoming data.

Alternatively, the coarse tuning may make use of other clocks available in the transceiver and the fine tuning may be performed by adjusting a group delay of a digital filter or an auxiliary circuit, such as digitally controlled buffer stages. FIG. 8b is a diagram illustrating a circuit 850 for delaying incoming data. The circuit 850 may delay incoming data by an N-stage delay 855. The N-stage delay 855 may be implemented as a sequence of N flip flops, for example. After being delayed by the N-stage delay 855, the incoming data may be downsampled by a factor of N1 or N2 by downsampler 857 to a data clock rate of CLKA/N1 or CLKA/N2, respectively. The downsampler 857 may downsample the incoming data by a factor of N1 or N2, wherein N1 and N2 may be two clock division ratios that are available as selectable options. They may used to help time align the downsampled incoming data with aggressor(s) at the DCO 380. If needed, programmable delay alignment options may be extended over multiple clock domains to achieve accurate alignment between the frequency push/pull correction term and the aggressor(s).

After being downsampled, the incoming data may be further delayed by an M-stage delay 859, with the M-stage delay 859 being implemented as a sequence of M flip flops, for example. The N-stage delay 855 may be timed in the CLKA domain, while the M-stage delay 859 may be timed in either the CLKA/N1 or CLKA/N1/N2 domain, with dividers 861 and 863 being used to change clock domains.

An IIR filter 865 with programmable coefficient XR may then be used to filter the retimed incoming data. The programmable coefficient XR may be programmed as needed to change group delay of the incoming data through the IIR filter 865, which may be fractional with respect to the clock of the IIR filter 865. Alternatively, the IIR filter 865 may be replaced with an finite impulse response (FIR) filter, which may provide linear control of group delay.

Figure 8C:
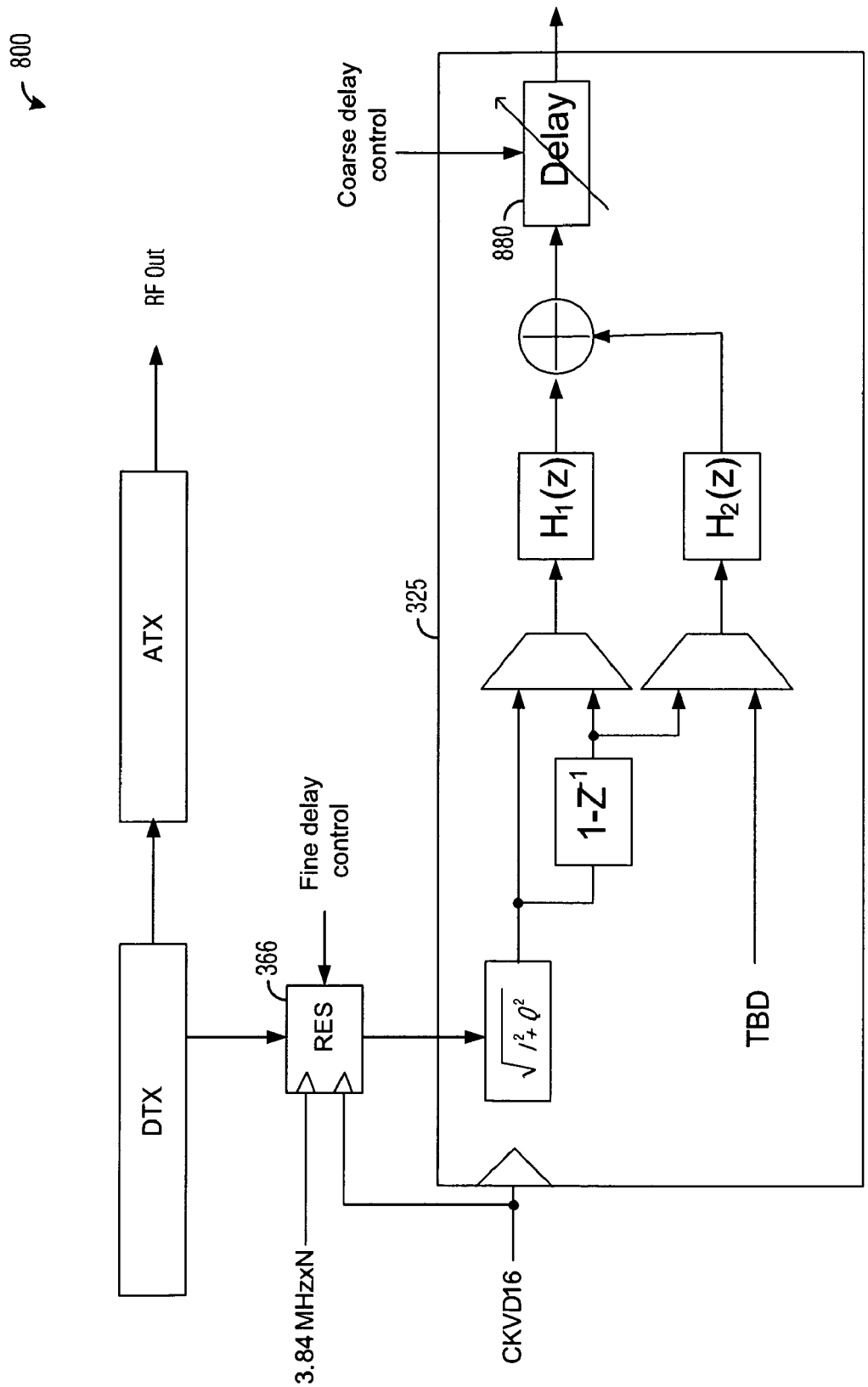
FIG. 8c is a diagram of a portion of a transmitter with a frequency push/pull compensation block containing a delay alignment circuit.

FIG. 8c illustrates a portion of a transmitter 800 with delay alignment circuitry. As stated previously, the delay alignment may occur in two phases, a coarse delay tuning performed by a delay unit 880 and a fine delay tuning performed by offsetting a clock used in the resampler 366.

Figure 8D:
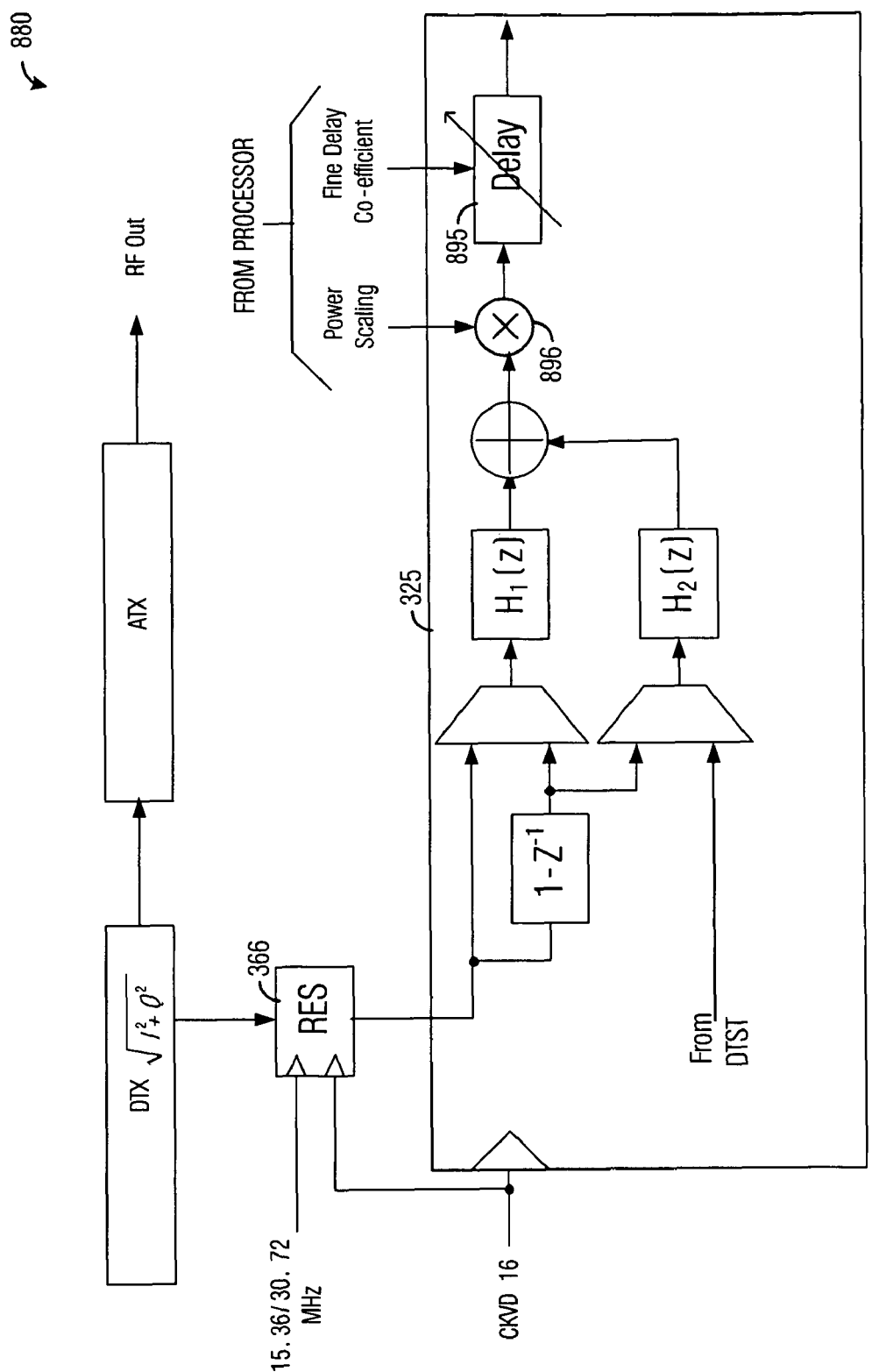
FIG. 8d is a diagram of a portion of a transmitter with a frequency push/pull compensation block containing a delay alignment circuit and a power scaling unit.

FIG. 8d illustrates a portion of a transmitter 890 with delay alignment circuitry and power scaling unit. The transmitter 890 may allow for delay alignment to occur at the resampler 366 or a delay unit 895. Both the resampler 366 and the delay unit 895 may allow for fine delay tuning. A power scaling unit 896 may be used to scale the frequency push/pull correction term. Both the delay unit 895 and the power scaling unit 896 may be controlled by signals provided by a processor.

FIG. 9 illustrates a sequence of events 900 in the cancellation of frequency push/pull occurring in a VCO or DCO. Frequency push/pull may occur when a transceiver is in normal operation and signals (aggressors) coupled onto control signals of the VCO (or DCO) or onto the oscillator core may cause variations in an RF reference signal produced by the VCO or DCO. Therefore, the cancellation of frequency push/pull may occur whenever the transceiver is in normal operation. Alternatively a portion of the frequency push/pull cancellation may occur during an initialization or calibration stage. For example, aggressor signals may be characterized during initialization or calibration and their transfer characteristics may be stored for subsequent use.

In situations when it is known that pushing/pulling is not occurring, such as with low output transmit power, the frequency push/pull compensation block 325 may be turned off or bypassed. Turning off the frequency push/pull compensation block 325 may help to reduce power consumption, which may help to conserve battery life, for example.

The cancellation of frequency push/pull may begin with a computing of an error signal (block 905). The error signal may be a phase error signal or a frequency error signal and the error signal may be obtained at a variety of points in a signal path of the VCO or DCO. In the case of a DCO controlled by an ADPLL, the error signal may be obtained at outputs of the frequency detector 364, the frequency error accumulator 365, or the resampler 366, for example. The error signal may also be obtained from an output of the loop filter 367, however, the loop filter 367 may attenuate or alter the frequency characteristics of some or all of the aggressor(s).

The error signal may then be provided to an adaptation block, such as the adaptation block 410, where transfer characteristics of the frequency push/pull may be determined (block 910). The adaptation block 410 may use an appropriate adaptation algorithm, such as a gradient-based algorithm such as an least mean squared (LMS) algorithm or its variants, a stochastic gradient, any parametric tracking filter configuration such as least squares, Kalman filtering, etc., and so forth, to determine the transfer characteristics of the frequency push/pull. The adaptation block 410 may determine the transfer characteristics by comparing the error signal with the aggressors (or copies of the aggressors). The transfer characteristics may be stored in the form of filter coefficients, for example.

The transfer characteristics of the frequency push/pull may then be provided to a compensation filter, such as the compensation filter 415, where the transfer characteristics may be used to extract the aggressors from transmitted signal, producing a frequency push/pull correction term (block 915). The compensation filter 415 may be implemented as a look-up table, a FIR filter, a polynomial, or so on. The frequency push/pull correction term may then be normalized and/or delay aligned (block 920). Normalizing may involve normalizing the frequency push/pull correction term with a gain of the DCO, KDCO, and adjustments for a transmit power and delay aligning may align the frequency push/pull correction term with the aggressors to increase the effectiveness of the frequency push/pull cancellation.

The frequency push/pull correction term may then be applied to the VCO 380 (block 925). The frequency push/pull correction term may be combined with FCW being provided to the VCO 380. The frequency push/pull correction term may be negative frequency versions of the aggressors and when combined appropriately with the FCW, which may be distorted due to frequency pushing/pulling aggressor artifacts in the oscillator feedback, the aggressors and the frequency push/pull correction term may combine to substantially zero each other out.

FIG. 10*a* illustrates a sequence of events 1000 in the computing of an error signal. The sequence of events 1000 may occur during a transceiver's normal operation mode, wherein the transceiver may be susceptible to frequency push/pull. The computing of an error signal may begin with a reading of a frequency or phase error signal from a point in the feedforward path of an ADPLL in the transceiver (block 1005). As discussed previously, the frequency or phase error signal may be obtained at a variety of points in the feedforward path, such as at outputs of the frequency detector 364, the frequency error accumulator 365, the resampler 366, and so forth. The frequency or the phase error signal may also be obtained at an output of the loop filter 367, however, the filtering provided by the loop filter 367 may negatively impact the impact of the aggressor(s) present in the frequency or phase error signal. If the phase error signal is read from the feedforward path, it may be necessary to differentiate the phase error signal to obtain a frequency error signal. After reading the frequency or phase error signal, the frequency or phase error signal may be filtered to help remove high frequency digitization noise (block 1007) and/or undesired frequency components. The error signal may now be ready for use in the cancellation of frequency push/pull.

FIG. 10*b* illustrates a sequence of events 1020 in the computing of an error signal. The computing of an error signal may begin with a reading of a frequency or phase error signal from a feedforward path of the ADPLL (block 1025). If the phase error signal is read from the feedforward path, it may be necessary to differentiate the phase error signal to obtain a frequency error signal. The frequency or phase error signal may then be filtered to help remove high frequency quantization or other corruptive frequency-domain noise (block 1027). Additionally, an aggressor(s) signal may be read from a transmit data path of the transmitter (block 1029). The aggressor(s) signal may then be differentiated and filtered (block 1031). The filtered frequency or phase error signal and the differentiated and filtered aggressor(s) signal may then be used to compute an error gradient (block 1033). The error gradient may be a weighted sum of the aggressor and the frequency or phase error signals. The error gradient may now be ready for use in the cancellation of frequency push/pull.

FIG. 10*c* illustrates a sequence of events 1040 in the computing of an error signal. The computing of an error signal may begin with a reading of a phase error signal at an output of the resampler 366 of the feedforward path of the ADPLL (block 1045). Since the phase error signal is used, it may be necessary to differentiate the phase error signal to obtain a frequency error signal (block 1047). After differentiation, the frequency error signal may be filtered to help eliminate high frequency noise (block 1049). The frequency error signal may then be used to compute an error gradient (block 1051). The error gradient may be computed with I and Q data from the transmit data path, or other aggressor signals. The error gradient may now be ready for use in the cancellation of frequency push/pull.

FIG. 10*d* illustrates a sequence of events 1060 in the computing of an error signal. The computing of an error signal may begin with locking the ADPLL to a specified frequency (block 1065). Then, a reference signal source with a frequency that may be a fraction, such as ¼-th, ⅛-th, or so forth, of the specified frequency to a dedicated phase detector (block 1067). The auxiliary phase detector may be able to detect the phase of the DCO 380 with higher resolution (or lower quantization noise). The output of the phase detector may be used as the error signal. The error signal may now be ready for use in the cancellation of frequency push/pull.

Figure 11:
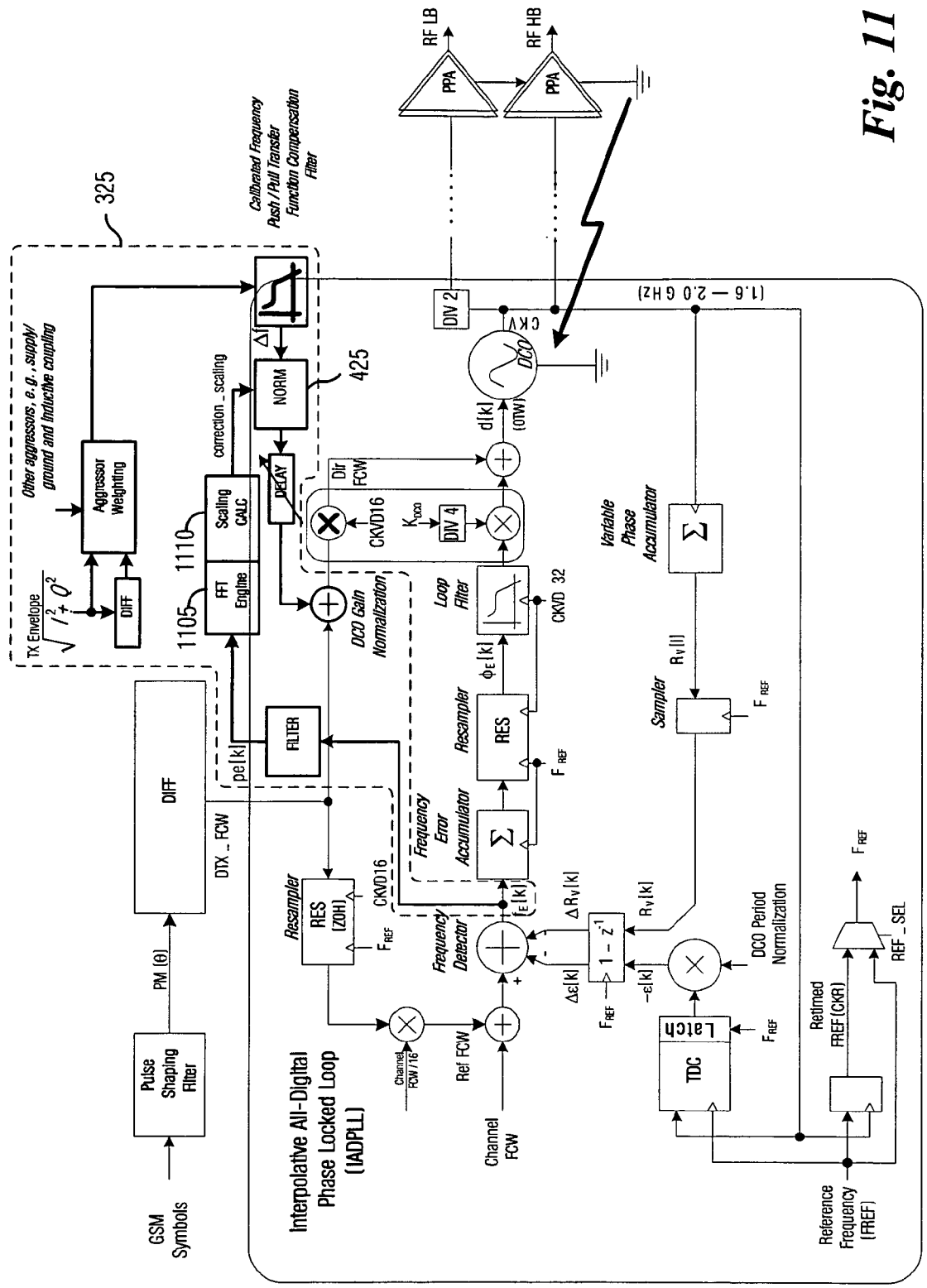
FIG. 11 is a diagram of a transmitter with a frequency pushing/pulling compensation circuit having parameter adjustment capability.

FIG. 11 is a diagram illustrating a transmitter, wherein the transmitter includes a frequency pushing/pulling compensation circuit 325 with parameter adjustment capability. While the transmitter is in operation, the frequency pushing/pulling compensation circuit 325 may require adjustments to parameters, such as the frequency push/pull correction term. The parameter adjustments may be due to changes in power level, operating temperature, transmitter loading, and so forth. In order to track such dynamic changes, normalization (such as that which occurs in the normalizing and/or delay aligning (block 920 of FIG. 9)) may comprise the scaling of the frequency push/pull correction term, based upon an extent of pushing/pulling at a respective transmitter power level and other scaling to map the correction to the local oscillator's control voltage (for a VCO) or a control word (for a DCO).

This may be especially true if part of the frequency push/pull compensation as performed by an adaptation block, such as the adaptation block 489, is performed off-chip, since direct observation of frequency and/or phase error may not be possible off-chip. Rather, the amount of local oscillator pushing/pulling may be tracked dynamically by performing a Fourier transform 1105 (a single or multi-point Fast Fourier Transform, for example) on the estimated phase error (from the on-chip ADPLL or the PD). The Fourier transform 1105 may be implemented in either hardware or software. A scaling calculator 1110 may be used to scale the frequency push/pull correction term based on the results of the Fourier transform 1105. For example, the Fourier transform 1105 may be used to measure a magnitude of the estimated phase error at a specified frequency. The measured magnitude may then be used by the scaling calculator 1110 to adjust the frequency push/pull correction term.

Furthermore, depending on the type of modulation used in the transmitter, a single (or a set of) point(s) on the local oscillators phase noise trajectory may be tracked and used as a measure to adjust, scale, or limit the amount of the correction applied to the local oscillator. The measure may be computed using the calibrated transfer function. The scaling calculator 1110 may also be used to adjust, scale, or limit the amount of the correction.

Also shown in FIG. 11, the reuse of a direct modulation path of the ADPLL to apply the correction to the DCO (output of the scaling calculator 1110 provided to the normalizer 425, for example). Additionally, the scaling calculator 1110 may be implemented as a function of a one-point Fourier transform (e.g., a one-point FFT), a weighted sum of FFT offsets. Further, the scaling calculator 1110 may account for a software computed adjustments, using a processor located in the transmitter or a communications device containing the transmitter.

Figure 12:
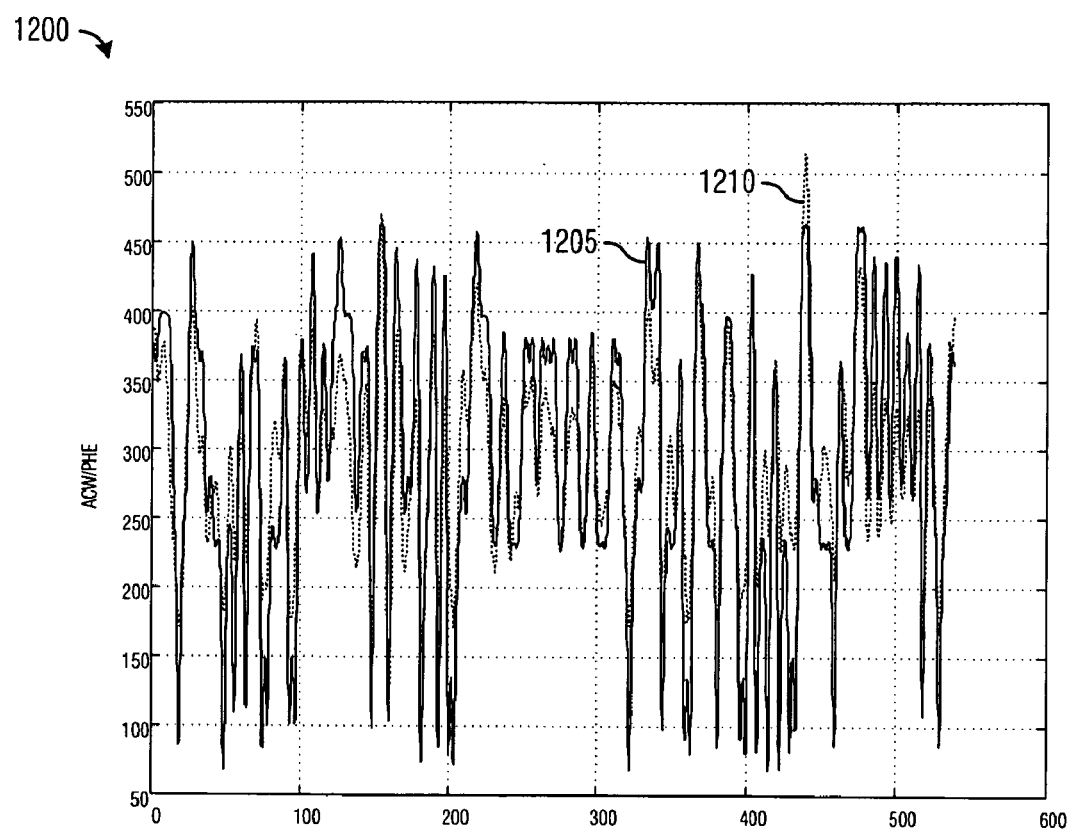
FIG. 12 is a data plot of amplitude control word and/or phase error versus time.

FIG. 12 illustrates a data plot 1200. The data plot 1200 displays a first trace 1205 (solid line) and a second trace 1210 (dashed line). The first trace 1205 represents an amplitude control word (ACW) used to control a signal amplitude in a transmit signal path and the second trace 1210 represents phase error (PHE) signal from phase-locked loop (PLL) over time. The data plot 1200 shows that there is a good correlation between ACW and PHE.

Figure 13:
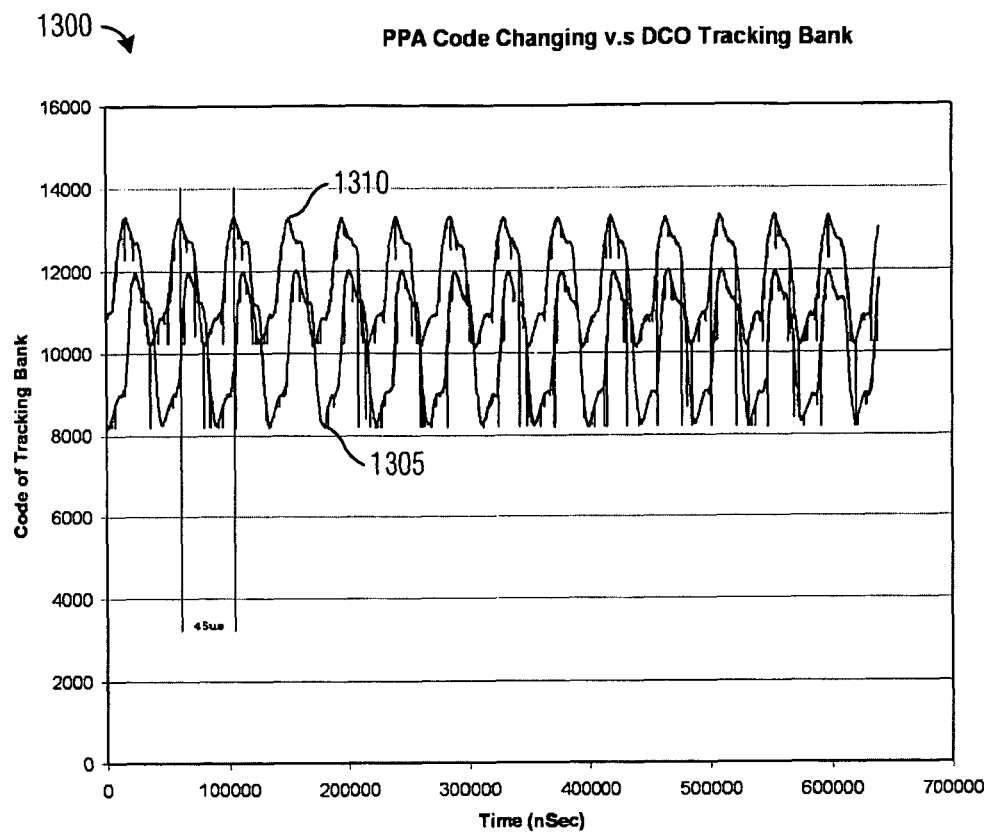
FIG. 13 is a data plot of DCO tuning versus PPA code steps.

FIG. 13 illustrates a data plot 1300. The data plot 1300 displays DCO tuning versus PPA code steps (time) for RF high band (trace 1305) and RF low band (trace 1310). The data plot 1300 shows that DCO tuning tracks tightly with PPA code steps, indicating a high degree of correlation.

Figure 14:
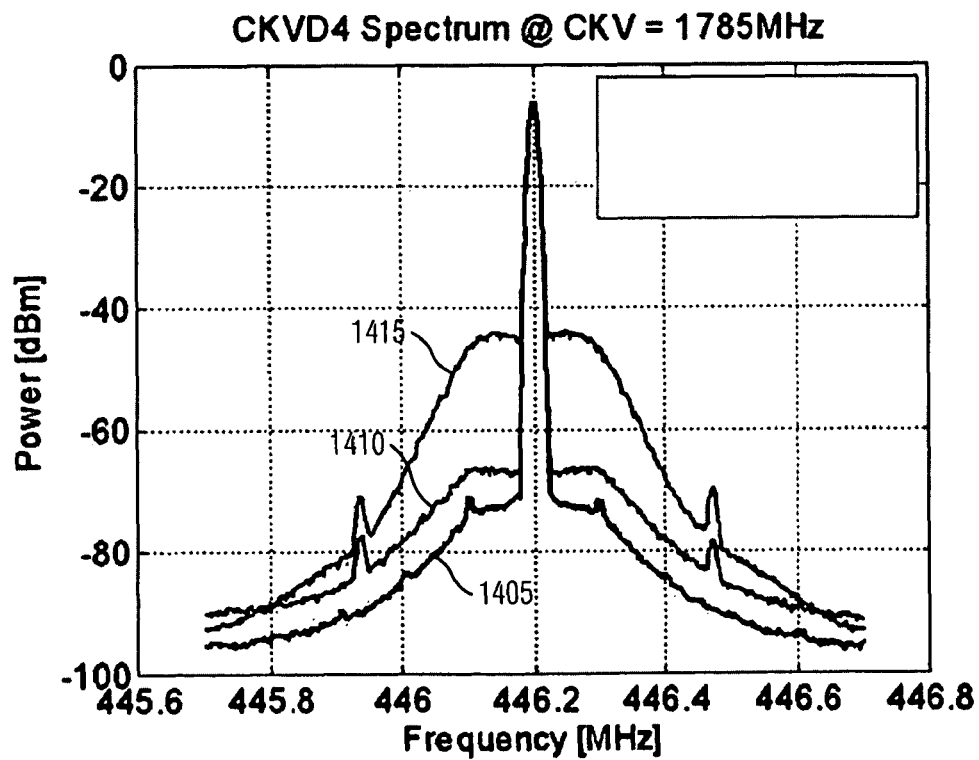
FIG. 14 is a data plot of DCO spectrum with and without frequency pushing/pulling.

FIG. 14 illustrates a data plot 1400. The data plot 1400 displays a spectrum of a DCO with and without frequency pushing/pulling. A first trace 1405 displays the spectrum of the DCO without frequency pushing/pulling, a second trace 1410 displays the spectrum of the DCO with about −10 dBm of frequency pushing/pulling, and a third trace 1415 displays the spectrum of the DCO with about +2 dBm of frequency pushing/pulling. The data plot 1400 shows that frequency pushing/pulling can provide distortion over a wide frequency range.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for cancelling frequency push/pull in an oscillator of a transmitter, the method comprising:
computing an error signal from a signal of a phase locked loop, wherein the error signal includes an aggressor signal;
computing transfer characteristics for the aggressor signal;
filtering a transmitted signal of the transmitter with the transfer characteristics to produce a correction term; and
applying the correction term to a frequency control word being provided to the oscillator.

2. The method of claim 1, wherein computing the transfer characteristics comprises computing the transfer characteristics for a transmitter aggressor signal.

3. The method of claim 1, further comprising after the filtering, normalizing the correction term.

4. The method of claim 3, wherein the normalizing comprises normalizing the correction term with a gain of the oscillator.

5. The method of claim 3, wherein the normalizing comprises normalizing the correction term based on a magnitude of a transmitted signal at a specified frequency.

6. The method of claim 1, further comprising prior to the applying, delay aligning the correction term and the aggressor signal.

7. The method of claim 6, wherein the delay aligning comprises a one or two-stage delay aligning, a coarse delay aligning or a fine delay aligning or both.

8. The method of claim 1, wherein computing the transfer characteristics comprises using an adaptive algorithm, wherein the adaptive algorithm comprises a least mean squared (LMS) algorithm, a gradient-based algorithm, a stochastic gradient, or a parametric tracking filter.

9. The method of claim 1, wherein the filtering comprises using a look-up table, a finite impulse response (FIR) filter, an infinite impulse response (IIR) filter, or a polynomial.

10. The method of claim 1, wherein computing the error signal comprises:
obtaining a frequency error signal or a phase error signal from a feedforward path of a phase locked loop controlling the oscillator; and
filtering the frequency error signal or the phase error signal.

11. The method of claim 1, wherein computing the error signal comprises:
obtaining a frequency error signal or a phase error signal from a feedforward path of a phase locked loop controlling the oscillator;
filtering the frequency error signal or the phase error signal;
obtaining a second transmitted signal, wherein the aggressor signal is contained within the second transmitted signal;
estimating the aggressor signal from the second transmitted signal; and
computing an error gradient from the filtered frequency error signal or the filtered phase error signal and the computed aggressor signal.

12. The method of claim 11, wherein the aggressor signal is estimated by filtering the second transmitted signal.

13. The method of claim 1, wherein computing the error signal comprises:
obtaining a phase error signal from a feedforward path of a phase locked loop controlling the oscillator;
differentiating the phase error signal to produce a frequency error signal;
filtering the frequency error signal; and
computing an error gradient from the filtered frequency error signal and a signal representing the aggressor signal.

14. The method of claim 13, wherein the signal comprises I and Q quadrature phased transmitted data, phase and amplitude modulated transmitted data, an envelope of the transmitted signal, or the aggressor signal.

15. The method of claim 13, wherein the transfer characteristics of the aggressor signal are obtained during a calibration phase of operation.

16. The method of claim 1, wherein computing the error signal comprises:

setting a phase lock loop controlling the oscillator to produce a radio frequency signal at a first frequency; and detecting a phase signal of the oscillator by applying a reference signal source to a phase detector, wherein the reference signal source produces signal at a frequency that is a fraction of the first frequency.

17. A circuit for frequency push/pull compensation of an oscillator, the circuit comprising:

a filter coupled to an error signal source, the filter configured to attenuate unwanted frequency noise in an error signal provided by the error signal source;

an adaptation unit coupled to the filter and to a transmit signal path, the adaptation unit configured to estimate transfer characteristics of an aggressor signal present in the error signal using a transmit signal from the transmit signal path;

a compensation unit coupled to the adaptation unit and to the transmit signal path, the compensation unit configured to generate a correction term from the transmit signal by applying the transfer characteristics; and a normalizer coupled to the compensation unit, the normalizer configured to normalize the correction term to a gain of the oscillator.

18. The circuit of claim 17, further comprising a delay align unit coupled to the normalizer, the delay align unit configured to align the correction term to the aggressor signal.

19. The circuit of claim 17, wherein the adaptation unit implements an adaptive algorithm that comprises a least mean squared algorithm, a gradient-based algorithm, a stochastic gradient algorithm, or a parametric tracking filter algorithm.

20. The circuit of claim 17, wherein the compensation unit comprises a look-up table, a finite impulse response filter, an infinite impulse response filter, or a polynomial.

21. The circuit of claim 17, wherein the error signal is a phase error signal or a frequency error signal, and the circuit further comprising a differentiator coupled between the error signal source and the filter, the differentiator to differentiate the phase error signal to produce a frequency error signal.

22. The circuit of claim 17, wherein the normalizer is further configured to measure a magnitude of a transmitted signal of a transmitter coupled to the oscillator and to scale the correction term based on the magnitude.

23. A transceiver comprising:

a digital transmit path coupled to a data source, the digital transmit path configured to perform digital signal processing on transmit data provided by the data source;

an analog transmit path coupled to the digital transmit path, the analog transmit path configured to perform analog signal processing on transmit data provided by the digital transmit path;

a digital oscillator path configured to produce a control signal for use generating a radio frequency signal, wherein the control signal is based on difference between a reference radio frequency signal and a feedback signal based on an actual frequency of the radio frequency signal;

an analog oscillator path coupled to the digital oscillator path, the analog oscillator path configured to produce the radio frequency signal based on the control signal; and a frequency compensation unit coupled to the digital transmit path and to the digital oscillator path and to the analog oscillator path, the frequency compensation unit configured to generate a correction term to compensate for frequency push/pull due to an aggressor signal induced onto the control signal.

24. The transceiver of claim 23, wherein the frequency compensation unit comprises:

a first multiplexer coupled to a transmit signal amplitude unit and to a differentiator, the first multiplexer to selectively couple an output of the transmit signal amplitude unit or an output of the differentiator to a first multiplexer output;

a second multiplexer coupled to the differentiator and to an aggressor input, the second multiplexer to selectively couple the output of the differentiator or the aggressor input to a second multiplexer output;

a first filter coupled to the first multiplexer, the first filter to filter a first signal provided by the first multiplexer with a first set of filter coefficients;

a second filter coupled to the second multiplexer, the second filter to filter a second signal provided by the second multiplexer with a second set of filter coefficients; and a summing point coupled to the first filter and to the second filter, the summing point to combine outputs of the first filter and the second filter to produce the correction term.

25. The transceiver of claim 24, wherein the frequency compensation unit further comprises:

a fine delay alignment adjustment unit coupled to the transmit signal amplitude unit, the fine delay adjustment unit configured to adjust an alignment between the correction term and the aggressor signal by resampling the transmit data with a high frequency clock; and a coarse delay alignment adjustment unit coupled to an output of the summing point, the coarse delay alignment adjustment unit configured to adjust the alignment between the correction term and the aggressor signal using a clock in the transceiver.

* * * * *